US 9,177,833 B2

(12) United States Patent
Nakajo et al.

(10) Patent No.: US 9,177,833 B2
(45) Date of Patent: Nov. 3, 2015

(54) SEMICONDUCTOR DEVICE AND METHOD OF MANUFACTURING THE SAME

(71) Applicant: Renesas Electronics Corporation, Kanagawa (JP)

(72) Inventors: Takuya Nakajo, Kanagawa (JP); Masaki Tamura, Kanagawa (JP); Yasushi Takahashi, Kanagawa (JP); Keiichi Okawa, Kanagawa (JP); Ryoichi Kajiwara, Hitachi (JP); Sigehisa Motowaki, Mito (JP); Hiroshi Hozouji, Hitachiota (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/768,509

(22) Filed: Feb. 15, 2013

(65) Prior Publication Data
US 2013/0228907 A1    Sep. 5, 2013

(30) Foreign Application Priority Data

Mar. 1, 2012    (JP) .................................. 2012-045115

(51) Int. Cl.
*H01L 23/48*    (2006.01)
*H01L 23/52*    (2006.01)
(Continued)

(52) U.S. Cl.
CPC ................ *H01L 21/56* (2013.01); *H01L 23/28* (2013.01); *H01L 23/49513* (2013.01); *H01L 23/49524* (2013.01); *H01L 23/49548* (2013.01); *H01L 23/49562* (2013.01); *H01L 23/49582* (2013.01); *H01L 24/32* (2013.01); *H01L 24/41* (2013.01); *H01L 24/48* (2013.01); *H01L 24/49* (2013.01); *H01L 24/83* (2013.01); *H01L 24/84* (2013.01); *H01L 24/85* (2013.01); *H01L 23/3107* (2013.01); *H01L 24/29* (2013.01); *H01L 24/45* (2013.01); *H01L 24/73* (2013.01);
(Continued)

(58) Field of Classification Search
USPC .................................. 257/666, 676, 739, 734
See application file for complete search history.

(56) References Cited

U.S. PATENT DOCUMENTS 7,205,180 B1 *  4/2007  Sirinorakul et al. .......... 438/123
7,964,975 B2     6/2011  Kajiwara et al.
(Continued)

FOREIGN PATENT DOCUMENTS

JP    08-046116 A    2/1996
JP    09-148508 A    6/1997
(Continued)

OTHER PUBLICATIONS

Communication dated Jul. 2, 2015 from the Japanese Patent Office in counterpart application No. 2012-045115.

*Primary Examiner* — S. V. Clark
(74) *Attorney, Agent, or Firm* — Sughrue Mion, PLLC

(57) ABSTRACT

Conventional surface roughening plating technology cannot always improve the adhesion between a leadframe and a plating film and it depends on the material used for surface roughening plating. Conventional surface roughening technology by etching can only be used for leadframes made of limited materials. Improved adhesion cannot therefore be achieved between a metal member such as leadframe and a sealing resin. A manufacturing method of a semiconductor device according to one embodiment is to carry out resin sealing using a metal member such as leadframe which has been subjected to alloying treatment of a base material and Zn plated on the surface thereof.

4 Claims, 23 Drawing Sheets

(51) Int. Cl.
*H01L 21/56* (2006.01)
*H01L 23/28* (2006.01)
*H01L 23/495* (2006.01)
*H01L 23/00* (2006.01)
*H01L 23/31* (2006.01)

(52) U.S. Cl.
CPC ............... *H01L2224/05624* (2013.01); *H01L 2224/0603* (2013.01); *H01L 2224/2929* (2013.01); *H01L 2224/29111* (2013.01); *H01L 2224/29116* (2013.01); *H01L 2224/29339* (2013.01); *H01L 2224/32245* (2013.01); *H01L 2224/40249* (2013.01); *H01L 2224/45014* (2013.01); *H01L 2224/45124* (2013.01); *H01L 2224/45144* (2013.01); *H01L 2224/45147* (2013.01); *H01L 2224/48247* (2013.01); *H01L 2224/48465* (2013.01); *H01L 2224/48472* (2013.01); *H01L 2224/48624* (2013.01); *H01L 2224/4903* (2013.01); *H01L 2224/49171* (2013.01); *H01L 2224/49505* (2013.01); *H01L 2224/73265* (2013.01); *H01L 2224/8392* (2013.01); *H01L 2224/83385* (2013.01); *H01L 2224/83439* (2013.01); *H01L 2224/8492* (2013.01); *H01L 2224/8592* (2013.01); *H01L 2924/1305* (2013.01); *H01L 2924/13091* (2013.01); *H01L 2924/15747* (2013.01); *H01L 2924/18301* (2013.01); *H01L 2924/351* (2013.01)

(56) References Cited

U.S. PATENT DOCUMENTS

| | | | |
|---|---|---|---|
| 2002/0153596 A1* | 10/2002 | Tsubosaki et al. | 257/666 |
| 2006/0097366 A1* | 5/2006 | Sirinorakul et al. | 257/666 |
| 2007/0001319 A1 | 1/2007 | Bauer et al. | |
| 2007/0096116 A1* | 5/2007 | Yasuda et al. | 257/79 |
| 2009/0197375 A1* | 8/2009 | Kajiwara et al. | 438/127 |
| 2011/0223720 A1* | 9/2011 | Kajiwara et al. | 438/124 |
| 2012/0141818 A1 | 6/2012 | Kajiwara et al. | |
| 2014/0001620 A1* | 1/2014 | Shimizu et al. | 257/676 |

FOREIGN PATENT DOCUMENTS

| | | |
|---|---|---|
| JP | 2002-299538 A | 10/2002 |
| JP | 2009-182159 A | 8/2009 |
| JP | 2012-116126 A | 6/2012 |

* cited by examiner

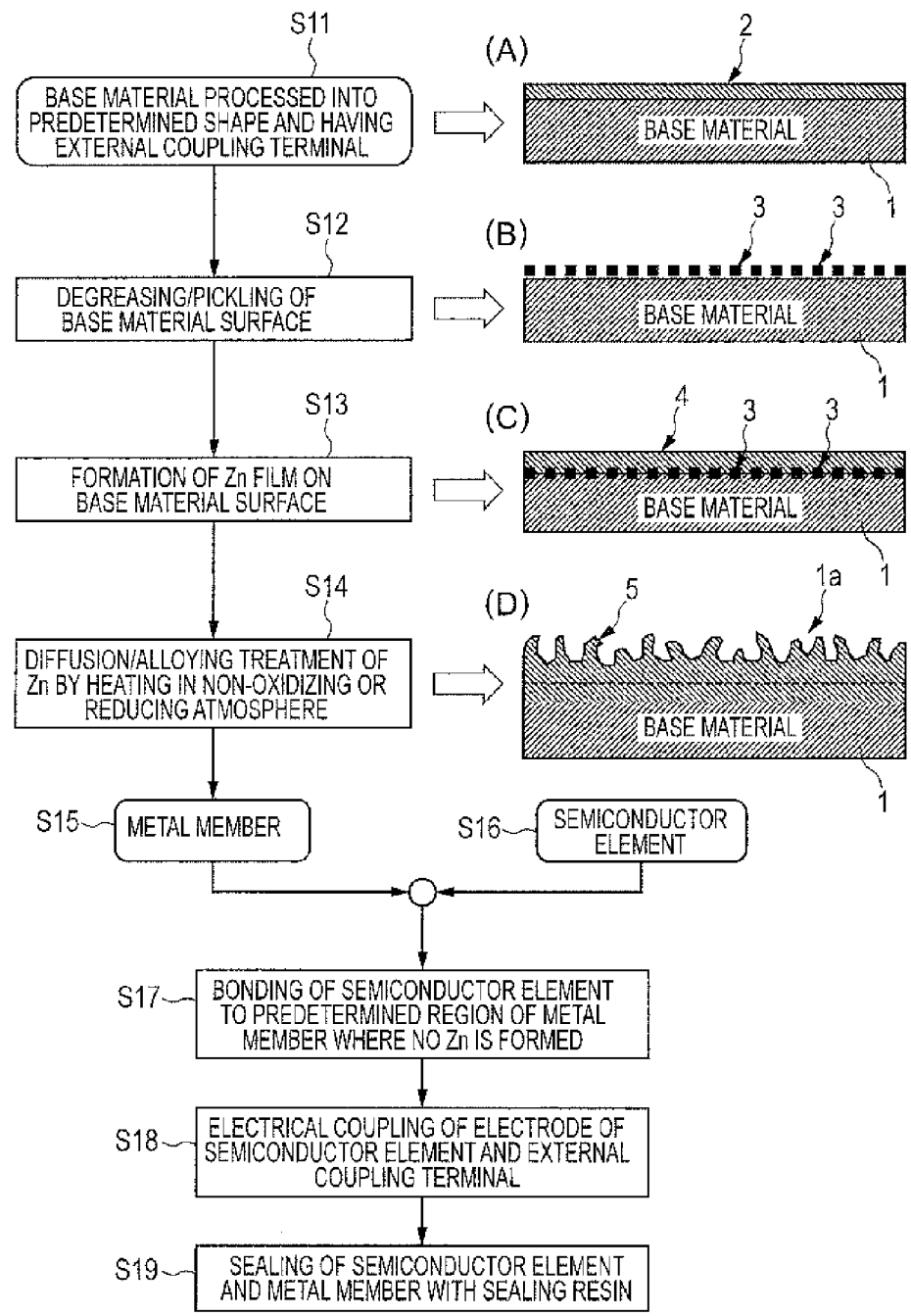

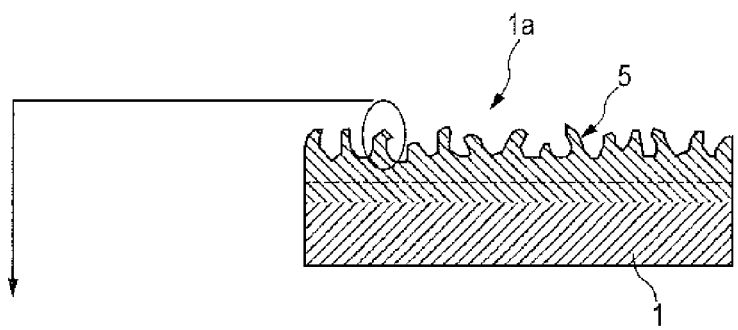
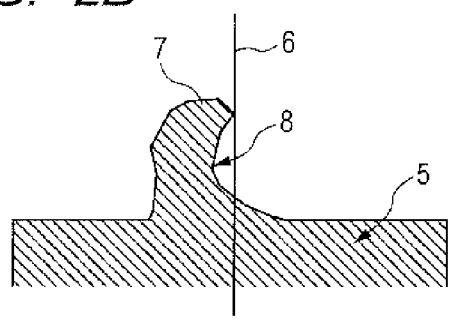

FIG. 9A
FIG. 9B
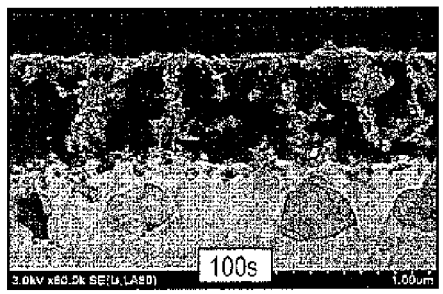
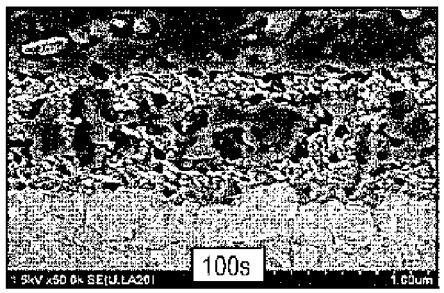
FIG. 10A
FIG. 10B
FIG. 10C
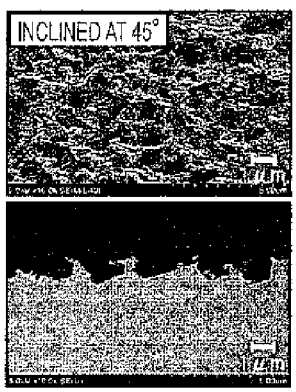
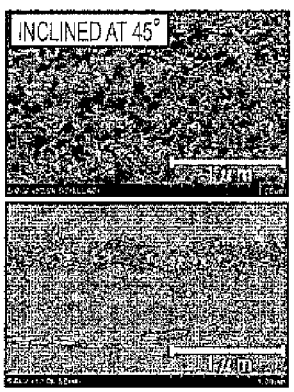
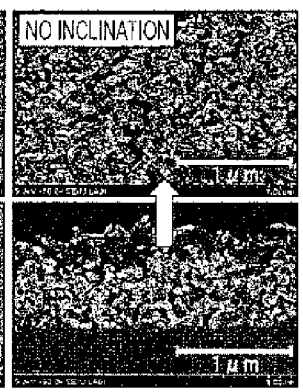

FIG. 27

| DEVICE | DIE BOND MATERIAL | LF SURFACE | DIE PAD | COUPLING MATERIAL | BOND PAD |
|---|---|---|---|---|---|
| POWER TRS | HIGH-MELTING-POINT LEAD SOLDER SnSb SOLDER | Ni | Ni | Al WIRE or Al RIBBON | Ni |
| | | Cu | Cu | | Cu |
| | | | Ni | | Ni |
| | Ag SINTER PASTE | Ni | Ag | | Ni |
| | | Cu | | | Cu |
| | | Ni | Ag | Ag PLATED Cu LEAD | Ag |
| | | Cu | | | |
| SMALL SIGNAL TRS SIGNAL PROCESSING LSI | RESIN Ag PASTE | Pd/Au | Pd/Au | Au WIRE | Pd/Au |
| | | Ag | Ag | | Ag |
| | | Ni | | | |
| | | Cu | | | |
| | Ag SINTER PASTE | Ni | Ag | | Ag | ations. In resin-sealing type
SEMICONDUCTOR DEVICE AND METHOD OF MANUFACTURING THE SAME

CROSS-REFERENCE TO RELATED APPLICATIONS

The disclosure of Japanese Patent Application No. 2012-045115 filed on Mar. 1, 2012 including the specification, drawings, and abstract is incorporated herein by reference in its entirety.

BACKGROUND

The present invention relates to a semiconductor device, particularly, a technology effective when applied to, for example, a resin-sealing type semiconductor device using a metal member.

Semiconductor devices used in the automotive field and the like are used under a severe usage environment so that they are required to have much higher reliability compared with those for consumer use or industrial use. In resin-sealing type semiconductor devices using a metal member, peeling of the sealing resin from the metal member (metal lead or the like) occurs due to moisture absorption of the resin and thermal stress in the sealing body (package). This peeling becomes a cause for generation of cracks at the joint between a semiconductor element and the metal member, leading to formation of defective semiconductor devices.

As a conventional method for firmly bonding a metal member and a sealing resin, a method of roughening the surface of the metal member by plating or etching is known.

For example, Japanese Patent Laid-Open No. 148508/1997 (Patent Document 1) discloses as follows relating to a resin-sealing type semiconductor device. A needle-like or dendritic roughened layer is formed by electroplating a Cu-based or Fe-based leadframe with Cu, CuNi, Zn, Ni, or the like at a current density exceeding the critical current density. A covering layer is then formed on the resulting roughened layer by electroplating it with two Cu and Zn layers, CuZn, Cr, ZnCr, two Ni and InZn layers, NiP, or two Ni and CuZn layers at a current density not greater than the critical current density. The roughened layer and the covering layer cooperatively contribute to improvement in bond strength between the leadframe and the resin and improvement in reliability such as moisture resistance, thermal shock resistance, or the like.

Japanese Patent Laid-Open No. 2002-299538 (Patent Document 2) discloses as follows relating to a leadframe and a semiconductor package using it. The surface of the leadframe to be brought into contact with a sealing resin is subjected to roughening plating, followed by plating, with a metal, a portion on the plated leadframe and necessary for wire bonding.

Japanese Patent Laid-Open No. 46116/1996 (Patent Document 3) discloses as follows relating to a leadframe. Either one of the following methods is used for forming a roughened surface on at least a portion of the surface of the leadframe to be molded. One of them is etching Cu or Ar in an aqueous solution containing a water soluble reducing agent such as ferric chloride or hydrazine. The other one is electrolytic etching with a nitrate-based electrolyte under treatment conditions of a voltage of 10V or greater but not greater than 50V and an anode current density of 40 A/dm$^2$ or greater but not greater than 200 A/dm$^2$. Formation of such a roughened surface improves adhesion between the leadframe and the molding resin.

Patent Document 1: Japanese Patent Laid-Open No. 148508/1997
Patent Document 2: Japanese Patent Laid-Open No. 2002-299538
Patent Document 3: Japanese Patent Laid-Open No. 46116/1996

SUMMARY

The surface roughening plating technology disclosed in Patent Document 1 or Patent Document 2 cannot always improve the adhesion between the leadframe and the plating film and it depends on the material of the surface roughening plating. In the etching-induced surface roughening technology disclosed in Patent Document 3, on the other hand, the material used for the leadframe is limited and therefore adhesion between a metal member such as leadframe and a sealing resin is not improved.

Other problems and novel features will be apparent from the description herein and accompanying drawings.

A method of manufacturing a semiconductor device according to one embodiment includes conducting resin sealing by using a metal member such as a leadframe which has been subjected to alloying treatment of a base material and Zn plated on the surface thereof.

With the above-mentioned embodiment as one example, it can improve the adhesion between the metal member and the sealing resin.

BRIEF DESCRIPTION OF THE DRAWINGS

FIGS. 1A, 1B, 1C, and 1D are a step flow chart showing a manufacturing method of a semiconductor device according to First embodiment and schematic cross-sectional views corresponding to the steps.

FIG. 1A shows a base material.
FIG. 1B shows degreasing and pickling treatment of the base material.
FIG. 1C shows formation of Zn film on the base material surface.
FIG. 1D shows diffusion and alloying treatment of Zn.
FIG. 2A and FIG. 2B are a cross-sectional view showing the definition of an overhang structure of First Embodiment to Seventh Embodiment.
FIG. 2A is a cross-sectional view showing a portion of the metal member 1a including the alloy layer 5.
FIG. 2B is a enlargement view showing a portion of the FIG. 2A.

FIG. 9A shows the sectional structure before sealing resin molding and FIG. 9B shows the sectional structure after sealing resin molding according to First Embodiment.

FIG. 10A-FIG. 10C includes SEM images showing the surface shape (upper stage) and the cross-sectional shape (lower stage) of a Cu plate after the respective surface treatments.

FIG. 10A shows a roughened surface by etching, FIG. 10B shows a roughened surface by Cu plating, and FIG. 10C shows a roughened surface by Zn plating and diffusion.

FIG. 13A is a plan view and FIG. 13B is a cross-sectional view taken along a line a-a' of FIG. 13A according to Second Embodiment.

FIG. 14A is a cross-sectional view and FIG. 14B is a side view of FIG. 14A observed from the direction W.

FIG. 20A is a plan view from which an upper portion of the sealing resin has been removed.

FIG. 20B is a cross-sectional view taken along a line a-a' of FIG. 20A.

FIG. 27 shows the relationship between the metallizing specifications of the leadframe surface of semiconductor devices to which Embodiments 1 to 7 are applied and connection materials or the like.

DETAILED DESCRIPTION

Figure 3:
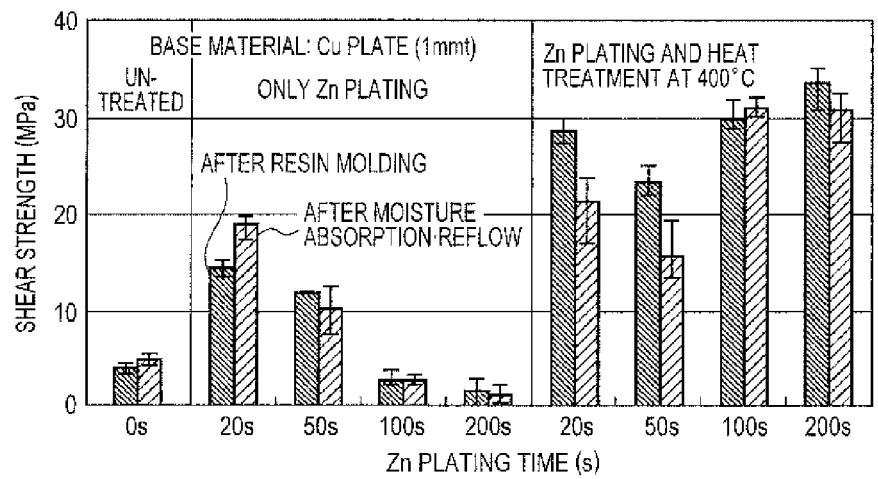
FIG. 3 shows a Zn plating time of a Cu plate and shear strength.

1. First, problems elucidated newly by the study and tests, analysis of the test results, and the like made prior to the present application by the inventors will next be described.

(1) Plating-Induced Roughening

A method of roughening plating of a Cu-based or Fe-based leadframe with Zn, Cu, Ni, or the like and then forming a covering layer on the resulting leadframe has the following problems, depending on the material used for roughening plating. Using the roughening plating method therefore makes it difficult to provide a resin-sealing type semiconductor device excellent in moisture resistance and thermal shock resistance.

(a) Particularly in Zn plating, when degreasing or oxide film removal before roughening plating is incomplete, adhesion with the leadframe lying thereunder is not improved and due to weak adhesion of the plating film, interfacial separation occurs between the plating film and the leadframe.

(b) Particularly, when as in a Ni-plated Cu flame, Ni and Cu are exposed from the surface of the leadframe, it is difficult to keep the best conditions of respective surfaces of different materials, because pre-treatment liquids suited for them are different. It is difficult to obtain, by the same plating treatment, a roughened surface with irregularities which is excellent in adhesion on both Cu surface and Ni surface and can provide a great anchoring effect.

(c) In roughening plating with Cu, it has poor adhesion with underlying Ni, making it difficult to select a proper underlying material. When Cu is an underlying metal, a dendritic roughened layer formed thereon can improve the bond strength, but it is difficult to obtain a stable and high-strength bonded portion because of difficulty in controlling thickness of the trunk of the dendrite and thickness of the roughened layer. Increasing the thickness of the dendritic roughened layer increases free Cu precipitates, which deteriorate the strength of the roughened layer itself. There is therefore a limitation in attaining a high anchor effect by roughening plating with Cu.

(d) Roughening plating with Ni is excellent in adhesion with Cu or Ni, but the irregular form of it is V-shaped and has openings with an upwardly increasing diameter so that a sufficient anchor effect cannot be achieved. It is therefore difficult to obtain, by using the same roughening plating method, a high-strength bonded portion to underlying Cu or Ni without depending on the material of the underlying metal.

(2) Etching-Induced Roughening

Etching-induced roughening, on the other hand, has the following problems.

(a) Since the surface is etched in this method, there is a possibility of a plated member losing its plating film. In addition, etchants differ, depending on the metal material so that in the case of a composite material, surfaces made of different metals cannot be roughened uniformly. As a result, bond strength becomes weak in some positions.

(b) Materials producing a great anchor effect when used for etching are only easily etched materials such as Cu and materials having good corrosion resistance such as Ni are not suited for use in etching-induced roughening. This method can therefore be used only for leadframes having Cu as a foundation. In this case, since bond strength in the peeling direction of the roughened surface is not so high, the Cu/resin interface of the bonded portion peels and cracks are generated at the solder joint of the chip in the early stage, leading to deterioration in impact resistance reliability. In particular, this problem tends to occur, for example, in a one-side molded package where a bonded area with a sealing resin is small.

2. Details of Embodiment

Embodiments will next be described specifically referring to accompanying drawings.

In the following embodiments, a description will be made after divided into a plurality of sections or embodiments if necessary for convenience sake. They are not independent from each other, but in a relation such that one is a modification example, an application example, a detailed description, a complementary description, or the like of a part or whole of the other one unless otherwise specifically indicated. In the following embodiments, when a reference is made to the number of elements (including the number, value, amount, range, or the like), the number is not limited to a specific number but may be greater than or less than the specific number, unless otherwise specifically indicated or principally apparent that the number is limited to the specific number.

Further, in the following embodiments, the constituting elements (including element steps or the like) are not always essential unless otherwise specifically indicated or principally apparent that they are essential. Similarly, in the following embodiments, when a reference is made to the shape, positional relationship, or the like of the constituting elements, that substantially approximate or similar to it is also embraced unless otherwise specifically indicated or principally apparent that it is not. This also applies to the above-mentioned number (including the number, value, amount, range or the like).

In all the drawings for describing the below-described embodiments, members of a like function will be identified by like reference numerals and overlapping descriptions will be omitted. In the following embodiments, a repeated description of the same or like parts will be omitted in principle unless particularly necessary.

First Embodiment (1) Constitution and method: FIG. 1 includes a step flow chart showing a manufacturing method of a semiconductor device according to First embodiment and schematic cross-sectional views corresponding to the steps.

In FIGS. 1A, 1B, 1C, and 1D are schematic cross-sectional views corresponding to steps shown on the left side, respectively. These schematic cross-sectional views show a portion of a base material processed into a predetermined shape and having an external coupling terminal. This is a region to which no semiconductor element is bonded and at the same time, a region which is to be plated with a Zn film 4 described below. Regions in which the external coupling terminal and the semiconductor element are to be coupled to each other are not shown in these drawings.

(a) A Step of Preparing a Metal Member

First, a step of preparing a metal member to be used in a fabrication step will be described. As shown in FIG. 1A, a base material 1 processed into a predetermined shape and having an external coupling terminal is prepared (Step S11). Here, the base material 1 is, for example, a leadframe.

The base material 1 contains, for example, a metal such as Cu or a Cu alloy and at the same time, has, on the surface of the material, one or more metallizing layers of any of Ni, Cu, Ag, Pd/Au, and the like (not illustrated).

The base material 1 has, on the surface thereof, an oxide film (natural oxide film) 2 as shown in the schematic cross-sectional view of FIG. 1A.

Then, as shown in FIG. 1B, the surface of the base material 1 is subjected to degreasing and pickling treatment (for example, alkaline electrolytic degreasing, rinsing, pickling, or the like) (Step S12).

As shown in FIG. 1C, a Zn film 4 is formed on the surface of the base material 1 by plating (Step S13). The Zn film 4 is not formed in some regions such as a region to which a semiconductor element is to be coupled. In other words, the Zn film 4 is formed selectively on the surface of the base material 1. The Zn film 4 has a thickness of from 0.1 μm to tens of μm, preferably from 1 μm to 5 μm. The Zn film 4 is formed, for example, by plating. Then, the base material 1 having the Zn film 4 formed thereon is heated in a non-oxidizing or reducing atmosphere to conduct alloying treatment through interdiffusion of the Zn film 4 and the metal member 1 (Step S14). Heating temperature is from 200° C. to 600° C., preferably from 300° C. to 400° C.

As a result, an alloy layer 5 having an irregular surface with an overhang structure is formed on the surface of the base material 1. In short, a metal member 1a which has been subjected to Zn diffusion alloying treatment is prepared (Step S15). When the lower surface or side surface of the base material 1, as well as the upper surface, is covered with a sealing resin, the alloy layer 5 is formed also on the lower surface or side surface.

(b) Fabrication Step

Next, a fabrication method of a semiconductor device will be described. The metal member 1a and a semiconductor element are prepared (Steps S15 and S16). The semiconductor element (not illustrated) is then bonded to a predetermined region (not illustrated) of the metal member 1a where the Zn film 4 is not formed. The predetermined region is a semiconductor element bonding portion and it corresponds to a die pad, tab, or the like. The die bond material usable here is, for example, a high-melting-point solder, an Ag sinter paste, a resin bonded Ag paste, or the like. The term "die bond material" as used herein means a material for bonding a semiconductor element to the semiconductor element bonding portion. The electrode (not illustrated) of the semiconductor element is electrically coupled to an external coupling terminal of the metal member 1a via a conductor (Step S18). As the conductor, for example, a bonding wire (not illustrated) or ribbon (not illustrated) is used. The electrode of the semiconductor element is made of, for example, Al. The bonding wire material is made of, for example, Al or Au. The ribbon material is made of, for example, Al.

The semiconductor element and the metal member 1a are sealed with a sealing resin (not illustrated) to form a semiconductor device (Step S19). The sealing is conducted, for example, by using transfer molding while using a thermosetting epoxy resin. The epoxy resin contains a filler. When the alloy layer 5 is formed on the lower surface or side surface of the metal member 1a, as well as the upper surface of the metal member 1a on which the semiconductor element is mounted, the lower surface or side surface may be covered with the sealing resin.

Steps S17 and S18 may be conducted prior to Step S12. This means that the semiconductor element is bonded to a predetermined region of the metal member 1a where the Zn film 4 is not formed (Step S17). The electrode of the semiconductor element and the external coupling terminal of the metal member 1a are electrically coupled to each other via a conductor (Step S18). After these steps, each of Step S12, S13, S14, and S19 may be conducted.

(2) Mechanism

Next, the formation mechanism of the alloy layer 5 having an irregular surface with an overhang structure will be described based on FIG. 1.

The base material shown in FIG. 1A is subjected to degreasing and pickling pretreatment. As a result, as shown in FIG. 1B, an oxide film 2 remains selectively as a residual oxide film 3 on the surface of the base material 1. The Zn film 4 electroplated at high speed on the surface of the base material 1 with high current density is, as shown in FIG. 1C, precipitated on the surface of the base material 1 not uniformly on the microlevel due to the residual oxide film 3. Precipitation starting points are dispersed locally.

There is a significant difference in the adhesion degree between the base material 1 and the Zn film 4, which depends on the difference in precipitation time. When diffusion treatment is performed under conditions not permitting melting of the Zn film 4, formation of the alloy layer 5 through the interdiffusion between the Zn film 4 and the base material 1 proceeds not uniformly but locally on the entire surface of the base material 1. As a result, irregularities ranging from nanometer ($10^{-9}$ m) to micrometer ($10^{-6}$ m) are formed on the surface after alloying. The metal element of the base material 1 forms the alloy layer 5 so as to spread from the diffusion inlet in the Zn film 4. The metal element of the Zn film 4 spreads from the diffusion inlet to the side of the base material 1 and causes the alloy layer 5 to grow so as to lift up this diffusion inlet region.

The position far from the inlet is indented. Due to the difference in interdiffusion rate, Kirkendall voids are generated on the metal element side where a diffusion rate is high. When some of the Kirkendall voids are exposed from the surface, opening portions are formed and an overhang structure having, on the inside thereof, a recess is formed.

The irregularities having this structure are specific to the film formation/diffusion treatment process and are characterized by that no interface exists between the alloy layer 5 and the base material 1 and both the crystal grains and the composition of the alloy layer are continuous from those of the base material 1.

Such an alloy layer 5 is integrated with the base material 1 so that peeling of this alloy layer 5 does not occur. More specifically, since the surface of the alloy layer 5 having a finely irregular surface with an overhang structure and the sealing resin are bonded to each other via a strong anchor effect, peeling does not occur at the interface between this alloy layer 5 and the sealing resin.

The interdiffusion phenomenon is the same even if the material of the base material 1 is different. When the base material 1 is made of a metal different from the above-exemplified Ni, Cu, Ag, or Pd/Au, a semiconductor device permitting firm bonding with the sealing resin can be obtained by the same treatment process.

In addition, the Zn film 4 having only a thickness of hundreds of nm to tens of μm can form necessary irregularities so that plating time for the film formation and consumption of a plating solution can be reduced, making it possible to realize a low-cost treatment process.

When such a manufacturing method according to Embodiment 1 is employed, the bond strength with the sealing resin corresponds to breaking strength in the resin irrespective of the material of the base material. A resin-sealing type semiconductor device can therefore be obtained which causes no peeling at the interface between the sealing resin and the metal member even exposed to a high-temperature high-humidity environment or drastic temperature fluctuations and exhibits high reliability for a long period of time.

The above-mentioned mechanism by which the alloy layer 5 having an irregular surface with an overhang structure is formed is also similar in Second Embodiment to Seventh Embodiment which will be described later. In short, the alloy layer is formed by the mechanism similar to that of First Embodiment.

(3) Definition of Overhang Structure

The definition of the overhang structure of the irregularities described in First Embodiment will next be described referring to FIG. 2.

FIG. 2 is a cross-sectional view showing the definition of an overhang structure of First Embodiment to Seventh Embodiment. It is a cross-sectional view showing a portion of the metal member 1a including the alloy layer 5. As shown in this drawing, with a perpendicular line 6 relative to the bottom surface of the metal member 1a as a standard, a recess 8 exists at the lower part relative to a projection 7 at the upper part. Such a structure is defined herein as "overhang structure". This will similarly apply to Second Embodiment to Seventh Embodiment which will be described later.

(4) Test Results

Test results of the manufacturing method of a semiconductor device according to First Embodiment will next be described referring to FIG. 3 to FIG. 11.

Figure 4:
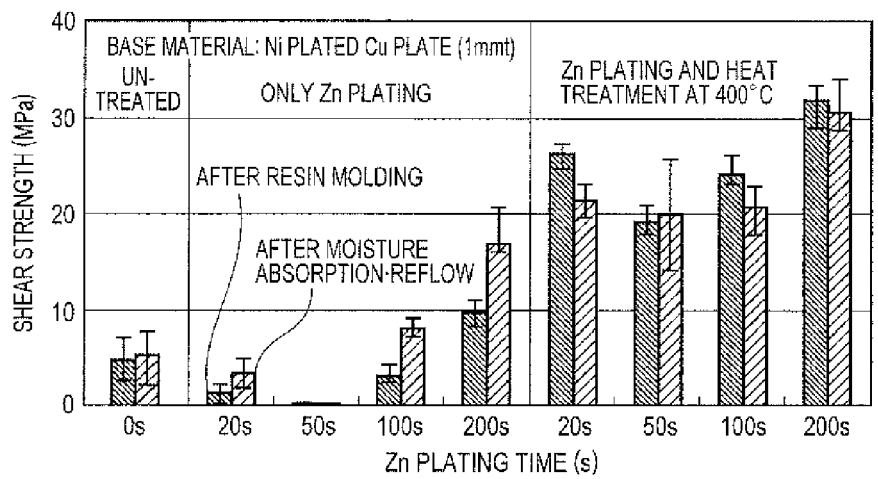
FIG. 4 shows a Zn plating time of a Ni-plated Cu plate and shear strength.

FIG. 3 shows Zn plating time of a Cu plate and shear strength. FIG. 4 shows Zn plating time of a Ni-plated Cu plate and shear strength.

The bond strength of the base material to a sealing resin is evaluated in two cases, that is, when the base material is a Cu plate (FIG. 3) and when the base material is a Ni-plated Cu plate (FIG. 4). The bond strength is indicated by shear strength (MPa).

FIG. 3 and FIG. 4 show the bond strength between a sealing resin and a sample without Zn plating, samples plated with Zn to respective film thicknesses, and samples which have been plated with Zn to respective film thicknesses and then heated (heat treated) at 400° C. for 2 minutes. Incidentally, Zn plating is conducted under the following conditions: at a plating solution temperature of 25° C. and a current density of 3 A/dm². The respective film thicknesses of Zn plating are indicated by plating time. The plating time of the sample without Zn plating corresponds to plating time of 0s which is indicated as "untreated".

Measurement results shown as the bond strength are both the bond strength after molding of the sealing resin and that of the resin molded sample after moisture absorption treatment at 85% and 85° C. for 168 hours and then reflow treatment at 260° C. three times. The former one is indicated as "after resin molding" and the latter one is indicated as "after moisture absorption and reflow".

The Cu plate of FIG. 3 and the Ni-plated Cu plate of FIG. 4 each have a thickness of 1 mm.

Figure 5:
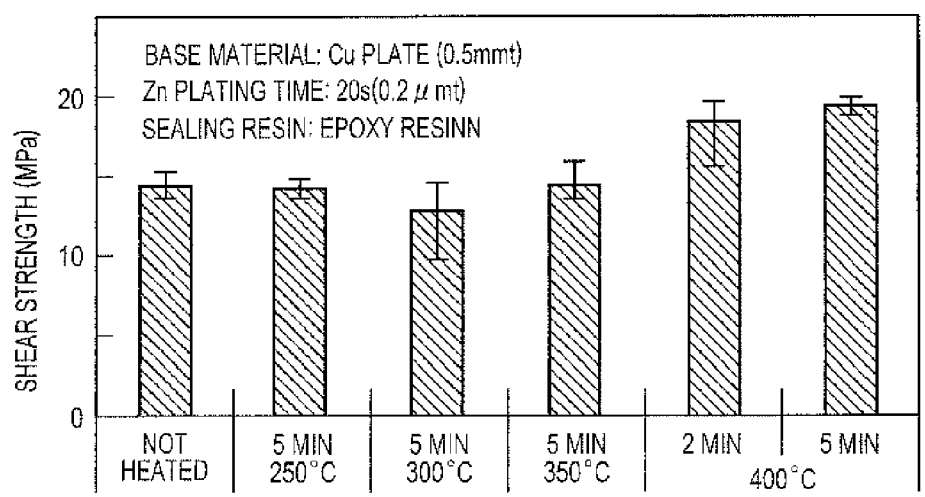
FIG. 5 shows the relationship between Zn diffusion treatment conditions of a Cu plate and shear strength.
Figure 6:
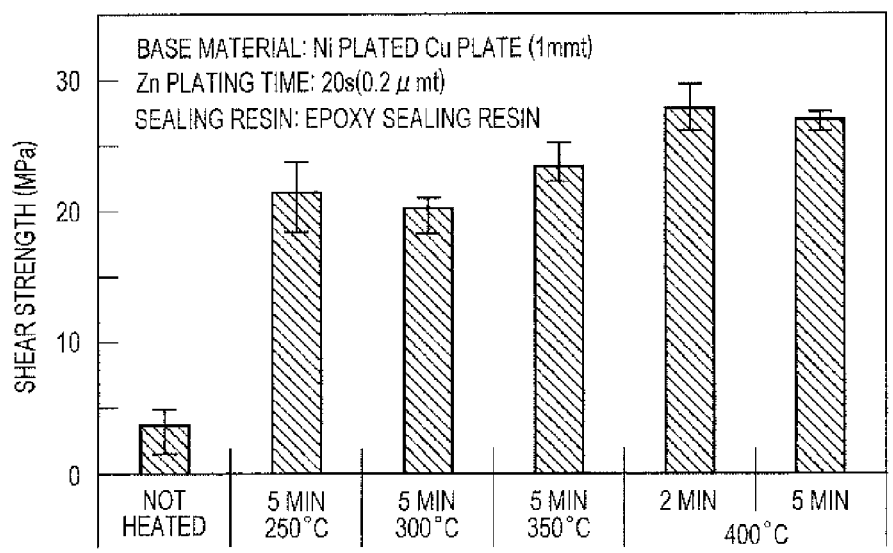
FIG. 6 shows the relationship between Zn diffusion conditions of a Ni-plated Cu plate and shear strength.

FIG. 5 shows the relationship between Zn diffusion treatment conditions of a Cu plate and shear strength. FIG. 6 shows the relationship between Zn diffusion treatment conditions of a Ni-plated Cu plate and shear strength.

FIG. 5 and FIG. 6 show the bond strength of the sealing resin when the Cu plate and the Ni-plated Cu plate are each treated at varied heat treatment temperatures and times (Zn diffusion treatment conditions). The thickness of the Cu plate is 0.5 mm and that of the Ni-plated Cu plate is 1 mm. As in FIGS. 3 and 4, the bond strength is indicated by shear strength (MPa). The Zn plating time is 20 s in both FIG. 5 and FIG. 6 and plating thickness is 0.2 μm. Zn plating is conducted under the following conditions: at plating solution temperature of 25° C. and a current density of 3 A/dm². As the sealing resin, an epoxy resin is used.

Figure 7:
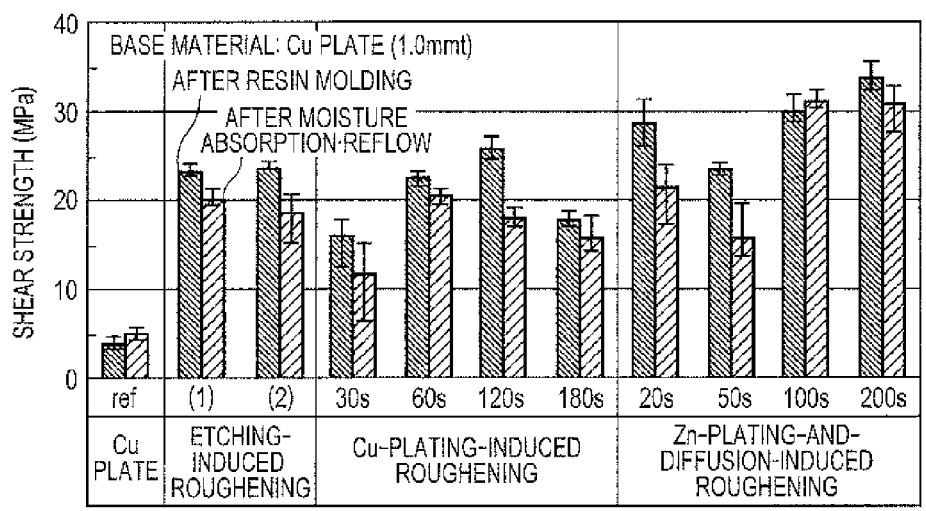
FIG. 7 shows comparison in shear strength between the surface treatment method in Comparative Example and the Zn diffusion alloying treatment method, each applied to a Cu plate.
Figure 8A:
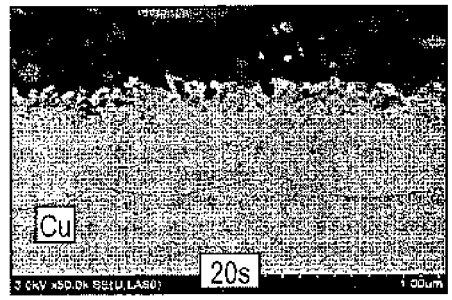
FIG. 8A-FIG. 8D includes cross-sectional SEM images, after molding, showing the cross-sectional structure of a Cu plate subjected to diffusion treatment while varying a Zn plating time according to First Embodiment.
Zn plating time of FIG. 8A is 20 s, that of FIG. 8B is 50 s, that of FIG. 8C is 100 s, and that of FIG. 8D is 200 s.
Figure 8B:
Figure 8C:
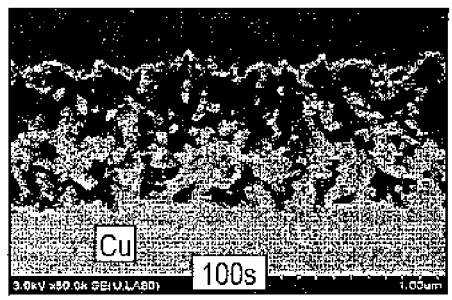
Figure 8D:
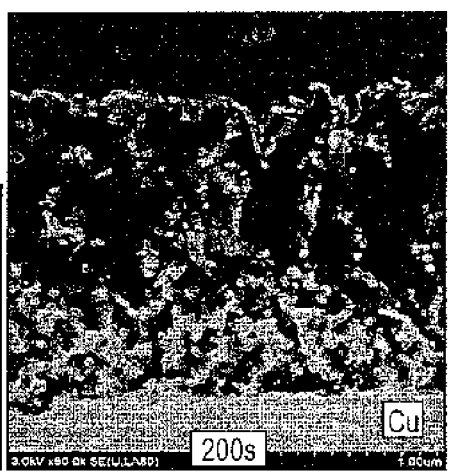

FIG. 7 shows comparison in shear strength between the surface treatment methods in Comparative Example and the Zn diffusion alloying treatment method according to First Embodiment, each applied to a Cu plate.

In FIG. 7, the surface treatment methods employed in Comparative Example are surface roughening by etching (etching-induced roughening) and Cu-plating-induced roughening. A Cu plate not subjected to surface roughening is also shown for comparison. The Cu plate not subjected to surface roughening is indicated as "ref".

The Cu plating time or Zn plating time is plotted along the abscissa. Zn plating is conducted under the following conditions: at plating solution temperature of 25° C. and current density of 3 A/dm². The base material is a Cu plate having a thickness of 1 mm. FIG. 7 includes measurement results of two samples. One of them is a sample after sealing resin molding, while the other one is a sample successively subjected to sealing resin molding, moisture absorption treatment at 85% and 85° C. for 168 hours, and reflow treatment three times at 260° C. The former one is indicated by "after resin molding" and the latter one is indicated by "after moisture absorption•reflow".

It has been found from FIG. 7 that when Zn plating is conducted for 100 s or greater, the shear strength is superior both after resin molding and after moisture absorption•reflow to that of the surface treatment method of Comparative Example.

As is apparent from FIG. 3 to FIG. 7, it has been confirmed that the Cu plate has improved bond strength by the heat treatment at 400° C. and the Ni-plated Cu plate has improved bond strength by the heat treatment at 250° C. or greater, compared with that without heat treatment.

In particular, it has been confirmed that the Ni-plated Cu plate has markedly improved bond strength by the heat treatment at 250° C. or greater.

In both the Cu plate and the Ni-plated Cu plate, the maximum strength is achieved under heating conditions of 400° C.

These results have revealed that stable resin bonding properties cannot be achieved only by Zn plating of a Cu plate or a Ni-plated Cu plate, but stable and high bond strength can be achieved when heat treatment is added. Moreover, shear strength is improved compared with the etching-induced roughening or Cu-plating-induced roughening in Comparative Examples.

It has also been found that as the Zn plating conditions for decreasing the deterioration due to moisture absorption and reflow and increasing the strength, the following plating conditions are preferred: at a plating solution temperature of 25° C., at a current density of 3 A/dm², and for a plating time of 100 s or greater (Zn film thickness≥about 1 μm).

FIG. 8 includes cross-sectional SEM (Scanning Electron Microscope) images showing the sectional structure, after sealing resin molding, of a Cu plate subjected to diffusion treatment by heating at 400° C. while varying the Zn plating time. In FIG. 8, Zn plating time of FIG. 8A is 20 s, that of FIG. 8B is 50 s, that of FIG. 8C is 100 s, and that of FIG. 8D is 200 s. FIG. 9 includes cross-sectional SEM images showing the sectional structure, before and after sealing resin molding, of the Ni-plated Cu plate subjected to Zn plating and then diffusion treatment by heating at 400° C. In FIG. 9, FIG. 9A shows the sectional structure before sealing resin molding and FIG. 9B shows the sectional structure after sealing resin molding. In FIG. 9, the Zn plating time is 100 s in both FIGS. 9A and 9B. The SEM images of FIGS. 8 and 9 are taken at the same magnification, that is, ×50000. Zn plating is conducted under the following conditions: at a plating solution temperature of 25° C. and a current density of 3 A/dm².

FIG. 8 and FIG. 9B show the structure at the interface between the metal member and the sealing resin bonded to each other. The metal member of FIG. 8 is made of an alloy of Zn and Cu, while the metal member of FIG. 9 is made of an alloy of Zn and Ni-plated Cu.

The metal member has, on the surface layer thereof, amorphous recesses and projections with a fine pitch and a filler contained in the sealing resin remains in the upper portion of the projections. On the other hand, it has been confirmed that firmly bonded interface is formed by the resin component of the sealing resin which has penetrated and filled the space of the recess.

In short, when the Zn plating time is 20 s or 50 s, the metal surface is not roughened sufficiently and an irregular surface with an overhang structure has neither a required height nor a required shape. On the other hand, when the Zn plating time is 100 s or 200 s, an irregular surface with an overhang structure has a sufficient height, the resin component has penetrated and filled the space of the recess, and the resin and metal have been bonded by a mechanical anchor effect.

It has been found that even when an upward force is applied to the resin, the resin which has penetrated inside the recess tangles with the metal portion to prevent the resin from being pulled upward at many places so that a strong mechanical anchor effect can be derived from the irregular form.

Figures 11A, 11B, 11C:
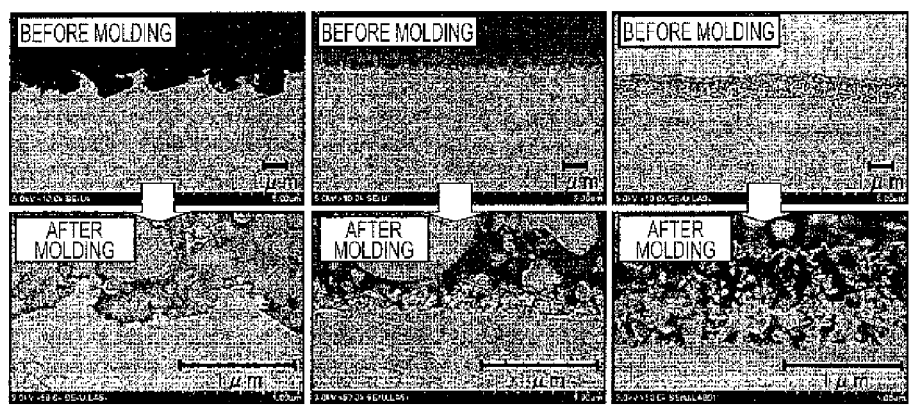
FIG. 11A shows the cross-sectional shape of the interface between the surface roughened by etching and the resin.
FIG. 11B shows the cross-sectional shape of the interface between the surface roughened by Cu plating and the resin.
FIG. 11C shows the cross-sectional shape of the interface between the surface roughened by Zn plating and diffusion and the resin.

FIG. 10 includes SEM images showing the surface shape (upper stage) and the cross-sectional shape (lower stage) of a Cu plate after the respective surface treatments. In FIG. 10, FIG. 10A shows a roughened surface by etching, FIG. 10B shows a roughened surface by Cu plating, and FIG. 10C shows a roughened surface by Zn plating and diffusion. They are roughened surfaces before sealing resin molding. The surface shapes (upper stage) of FIGS. 10A and 10B are taken at an inclination of 45°. The surface shape (upper stage) of FIG. 10C is taken without inclination. In FIG. 10, the Cu plating time in FIG. B is 120 s and that in FIG. 10C is 100 s. As can be seen from these drawings, the overhang structure on the roughened surface by Zn plating and diffusion is higher than that on the roughened surface by etching or roughened surface by Cu plating. FIG. 11 includes SEM images showing the cross-sectional shape of the Cu plate, before and after sealing resin molding, subjected to various surface treatment methods. In FIG. 11, the SEM image before sealing resin molding is shown in the upper stage, while that after sealing resin molding is shown in the lower stage. In FIG. 11, FIG. 11A shows the cross-sectional shape of the interface between the surface roughened by etching and the resin; FIG. 11B shows the cross-sectional shape of the interface between the surface roughened by Cu plating and the resin; and FIG. 11C shows the cross-sectional shape of the interface between the surface roughened by Zn plating and diffusion and the resin. The surface roughening by Zn plating and diffusion in FIG.

11C is conducted based on First Embodiment. In FIG. 11, the sample of FIG. 11A has a shear strength of 23.2 MPa; the sample of FIG. 11B has a shear strength of 25.6 MPa; and the sample of FIG. 11C has a shear strength of 30.0 MPa. The sample having a surface roughened by Zn plating and diffusion has the greatest shear strength and is excellent in resin bond strength.

The surface roughened by Zn plating and diffusion by heat treatment according to First Embodiment has an alloy layer which has a plurality of irregularities with an overhang structure and has a greater height and more recesses compared with the surface roughened by etching or surface roughened by Cu plating in Comparative Examples. The plurality of uneven portions having this overhang structure is filled fully with a sealing resin.

(5) Conclusion

As described above, due to the formation, on the surface of a metal member, of a Zn-containing layer having a plurality of irregularities with an overhang structure, a sealing resin bonded in a sealing step penetrates the recesses of the metal member to form an interface with good adhesion. Due to the mechanical anchor effect between the sealing resin and the metal member, a firm bonded portion can be obtained.

In the bonded portion obtained through the anchor effect, different from a bonded portion obtained through a chemical interaction, bond strength is not influenced by invasion of water so that high reliability can be maintained even after exposure to a high-temperature high humidity environment. As a result, a compressive stress by a sealing resin can be applied to the bonded portion between the semiconductor element and a portion of the semiconductor element to which the metal member is bonded. It is therefore possible to provide a resin sealing type semiconductor device capable of preventing generation of cracks at this joint and therefore having high reliability even under an environment where temperature fluctuations occur in repetition. Semiconductor devices having reliability high enough to be usable in severe environments such as automotive field can be provided.

Accordingly, it is possible to provide a manufacturing method of a semiconductor device capable of preventing peeling of the semiconductor element from the metal member even under a high-temperature high-humidity environment or even if thermal stress is applied in repetition.

In addition, by using the method of conducting Zn plating and then heating/alloying treatment in order to firmly bond the metal member, the bond strength with the sealing resin can be improved under the same treatment conditions without depending on the material of the metal member. As a result, a semiconductor device having high reliability can be provided even if the metal member is a composite member made of different metals.

Moreover, adhesion with the resin can be improved by the same treatment irrespective of the kind of the metal, which is effective for reducing the number of the treatment lines of the metal member and thereby reducing the equipment cost.

In addition, when a Zn metal plate is used as an electrode, it is possible to reduce the consumption amount of the Zn plating solution and moreover, conduct the pretreatment relatively roughly and carry out high-speed plating to reduce the plating time, which is effective for providing a treatment method requiring only a low running cost and therefore, reducing the production cost.

Second Embodiment

Figure 12:
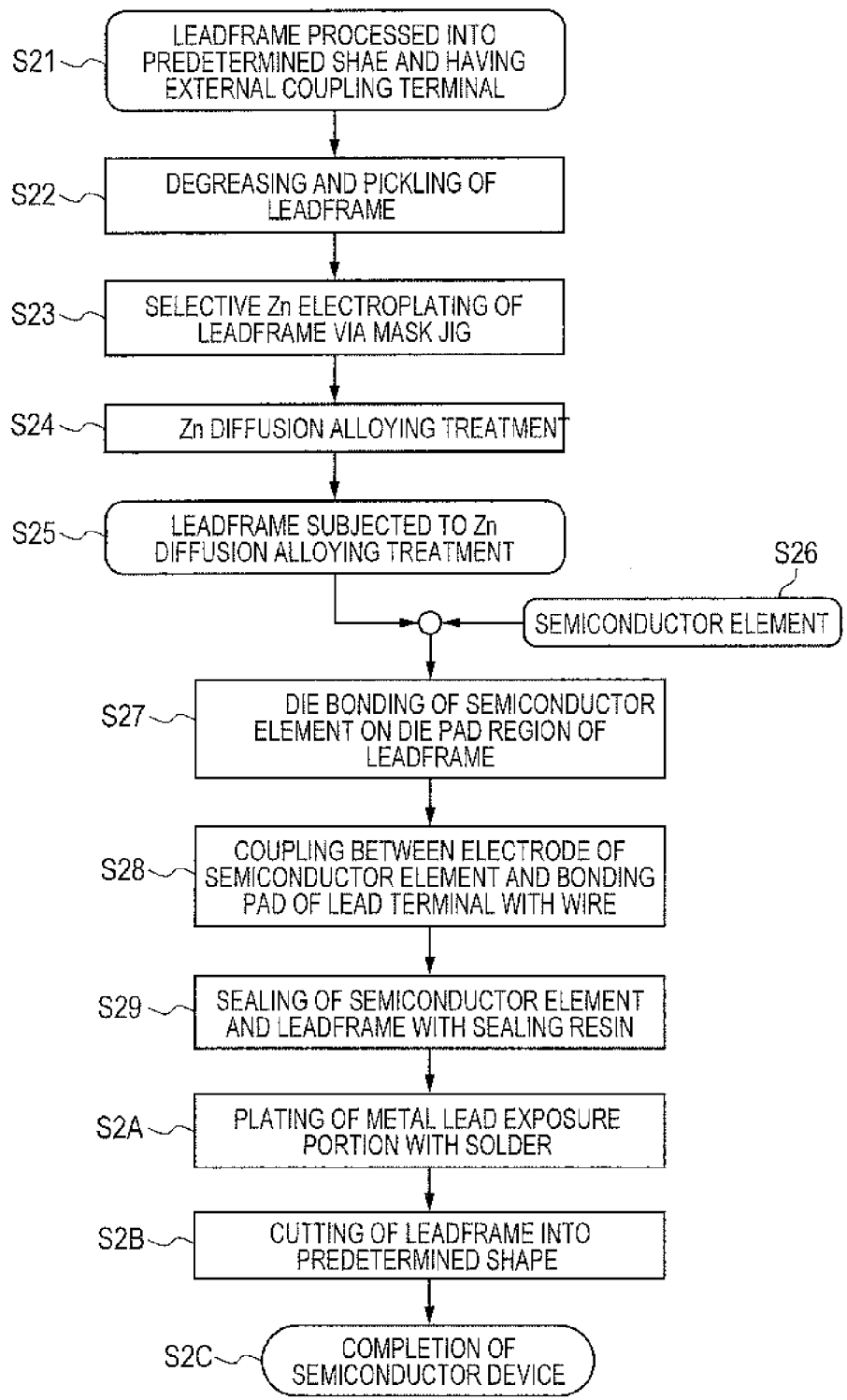
FIG. 12 is a step flow chart showing a manufacturing method of a semiconductor device according to Second embodiment.
Figure 13A:
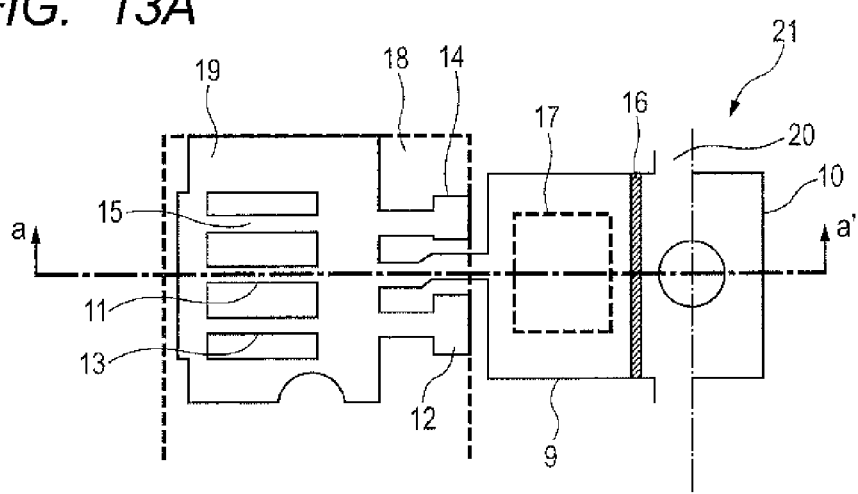
FIG. 13A and FIG. 13B shows a portion of a leadframe before Zn alloying treatment.
Figure 13B:
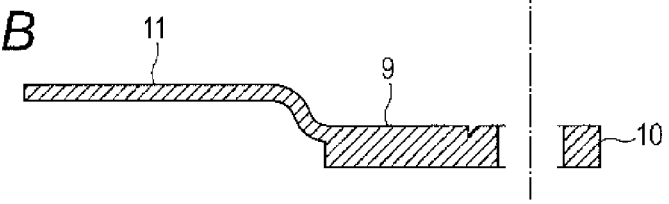
Figure 14A:
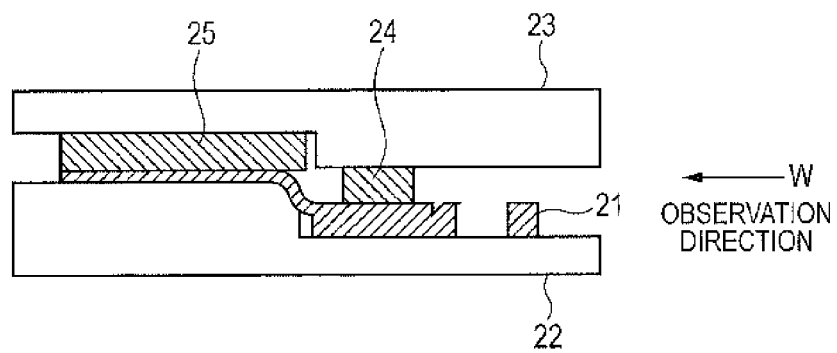
FIG. 14A and FIG. 14B shows a mask-jig attachment structure to the leadframe.
Figure 14B:
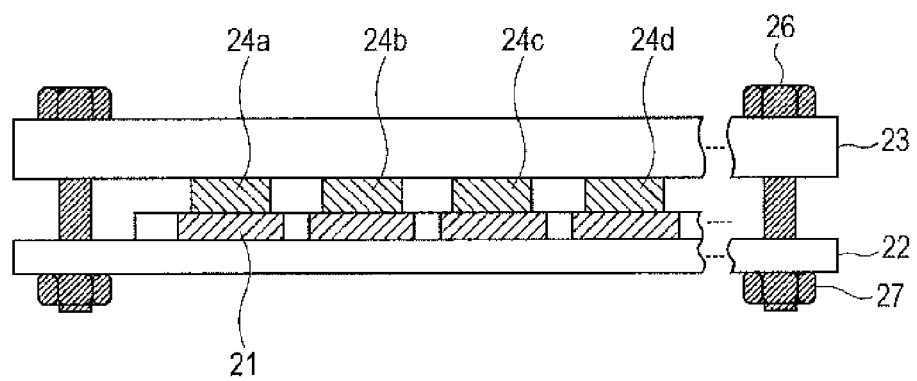
Figure 15:
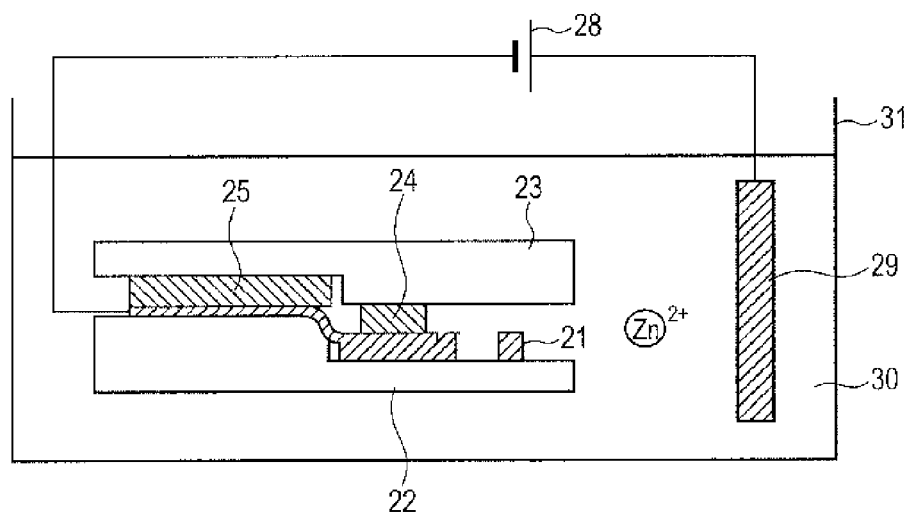
FIG. 15 shows a method of electro Zn plating of the leadframe to which the mask jig has been attached.
Figure 16A:
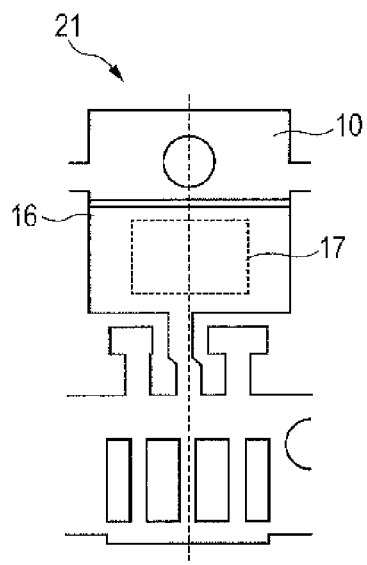
FIG. 16A is a plan view of the appearance of the leadframe before plating.
Figure 16B:
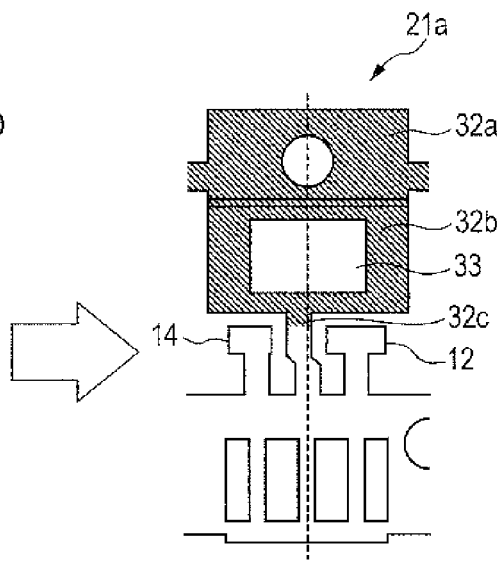
FIG. 16B is a plan view of the appearance of the leadframe after plating and alloying treatment.
Figure 17A:
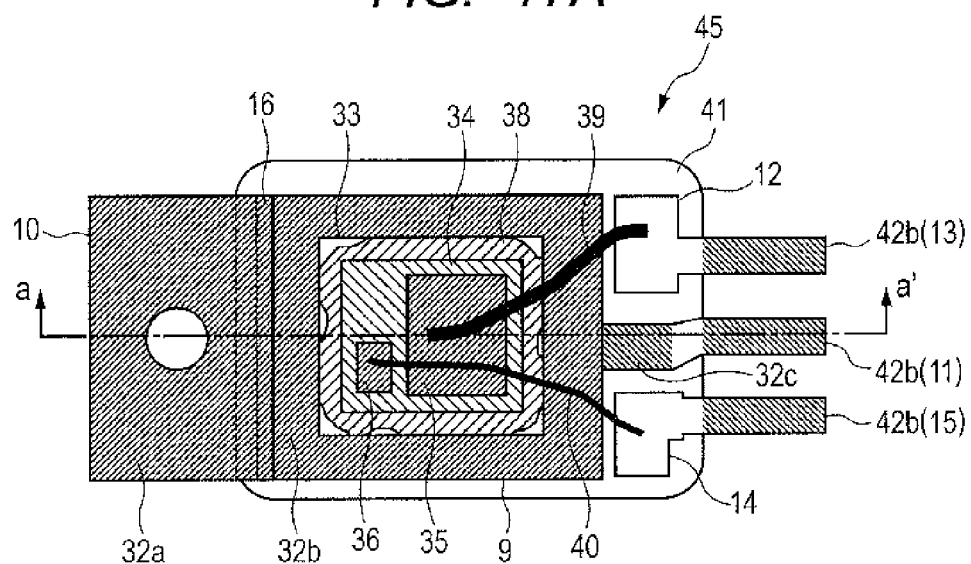
FIG. 17 shows a semiconductor device manufactured by the manufacturing method of a semiconductor device according to Second Embodiment.
Figure 17B:
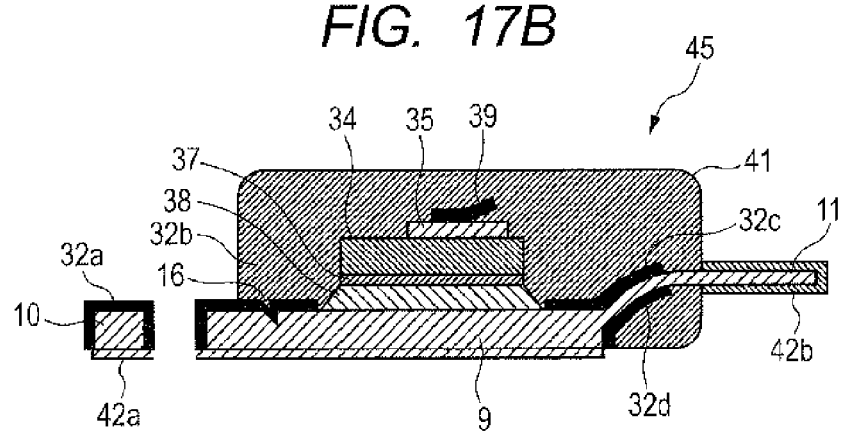

FIG. 12 is a step flow chart showing a manufacturing method of a semiconductor device according to Second Embodiment. FIGS. 13 to 16 show respective steps of the step flow shown in FIG. 12. FIG. 13 shows a portion of a leadframe before Zn alloying treatment. In FIG. 13, FIG. 13A is a plan view and FIG. 13B is a cross-sectional view taken along a line a-a' of FIG. 13A. FIG. 14 shows a mask-jig attachment structure to the leadframe. In FIG. 14, FIG. 14A is a cross-sectional view and FIG. 14B is a side view of FIG. 14A observed from the direction W. FIG. 15 shows a method of electro Zn plating of the leadframe attached with the mask jig. FIG. 16 shows the appearance of the leadframe before selective Zn plating using the mask jig and after plating and alloying treatment. In FIG. 16, FIG. 16A is a plan view of the appearance of the leadframe before plating and FIG. 16B is a plan view of the appearance of the leadframe after plating and alloying treatment. FIG. 17 includes a plan view and a cross-sectional view of a semiconductor device manufactured using the manufacturing method of a semiconductor device according to Second Embodiment, in which FIG. 17A is a plan view of the semiconductor device from which the upper portion of the sealing resin has been removed and FIG. 17B is a cross-sectional view taken along a line a-a' of FIG. 17A.

Second Embodiment is a manufacturing method of a semiconductor device using a leadframe subjected to Zn plating and alloying treatment.

According to the step flow described in FIG. 12, Second Embodiment will next be described referring to FIG. 12 and FIG. 13 to FIG. 17.

(1) Step of Preparing a Leadframe

First, a step of preparing a leadframe to be used in the fabrication step is described. A leadframe 21 processed into a predetermined shape and having an external coupling terminal, as described in FIGS. 13A and 13B, is prepared (Step S21). The leadframe 21 includes a die pad 9, a header 10, and a die pad lead terminal 11. In addition, the leadframe 21 includes a main electrode bonding pad 12, a main electrode lead terminal 13, a control electrode bonding pad 14, and a control electrode lead terminal 15. Furthermore, the leadframe 21 includes a framework 19 and a suspending lead 20. The header 10 has a penetration through. The die pad 9 and the header 10 have therebetween a sealing resin fixing trench 16. The die pad 9 has a first masking region 17 for masking a die pad region 33. The leadframe 21 has a second masking region 18 for masking a portion of the die pad lead terminal 11, the main electrode bonding pad 12, and the main electrode lead terminal 13. The leadframe 21 has a second masking region 18 for masking the control electrode bonding pad 14, the control electrode lead terminal 15, and the framework 19.

The leadframe 21 corresponds to the base material 1; the die pad region 33 corresponds to the semiconductor element bonding portion; and the die pad lead terminal 11, the main electrode lead terminal 13, and the control electrode lead terminal 15 correspond to external coupling terminals. The main electrode lead terminal 13 is also called a first lead terminal; the control electrode lead terminal 15 is also called a second lead terminal; and the die pad lead terminal 11 is also called a third lead terminal. The main electrode bonding pad 12 is also called a first pad; the control electrode bonding pad 14 is also called a second pad; and the die pad 9 is also called a third pad.

This leadframe 21 is degreased and pickled (Step S22). For example, alkali electrolytic degreasing, rinsing, pickling, or the like is conducted.

Then, as shown in FIG. 14, regions of the resulting degreased and pickled leadframe 21 which will not be plated (masking regions 17 and 18) are covered with rubber masks 24 and 25, which are mask jigs. The leadframe 21 and the rubber masks 24 and 25 are sandwiched between a lower hold jig 22 and an upper hold jig 23 and fixed with a sandwich bolt 26 and nut 27. As shown in FIG. 15, the leadframe 21 attached with the mask jig, an electrode 29, and a plating solution 30 are placed in a vessel 31 and the leadframe 21 and the electrode 29 are coupled to a power source 28 to conduct selective electro Zn plating (Step S23). The electroplating at this time is conducted at a current density of 3 A/dm$^2$ and plating time of 200 s.

The leadframe 21 selectively electroplated with Zn is heated in an H$_2$ gas atmosphere at 400° C. for 2 minutes to conduct Zn diffusion alloying treatment (Step S24). As a result, a leadframe 21a subjected to Zn diffusion alloying treatment can be prepared.

The state before plating and the state after Zn diffusion alloying treatment are shown in FIG. 16. In FIG. 16, FIG. 16A is a plan view showing the partial appearance of the leadframe 21 before selective plating, while FIG. 16B is a plan view showing the partial appearance of the leadframe 21a subjected to selective plating and then alloying treatment.

Roughened Zn alloy layers 32a, 32b, and 32c obtained by Zn plating and alloying treatment correspond to the alloy layer 5 of the semiconductor device according to First Embodiment obtained by alloying by interdiffusion between the Zn film 4 and the metal member 1 and having, on the surface of the metal member 1, an irregular surface with an overhang structure.

(2) Fabrication Step

Next, the fabrication step of the semiconductor device will be described. The leadframe 21a which has been subjected to Zn diffusion alloying treatment and a semiconductor element 34 are prepared (Step S25, Step S26). The semiconductor element 34 used here is, for example, a semiconductor chip such as MOS transistor or bipolar transistor. The semiconductor element 34 includes a main electrode 35, a control electrode 36, and a back electrode 37. The main electrode 35 is also called a first electrode, the control electrode 36 is also called a second electrode, and the back electrode 37 is also called a third electrode. As shown in FIG. 17, the back electrode 37 of the semiconductor element 34 is bonded onto a die bond region 33 of the die pad 9 with a die bond material 38 (Step S27). As the die bond material, for example, a high-melting-point solder, an Ag sinter paste, or a resin bonded Ag paste is usable.

The main electrode 35 of the semiconductor element 34 and the main electrode bonding pad 12 of the lead terminal 15 are coupled to each other via a wire 39 (Step S28). In addition, the control electrode 36 and the control electrode bonding pad 14 of the lead terminal 13 are coupled to each other via a wire 40 (Step S28). The wires 39 and 40 may be replaced by a ribbon or a lead. The material of the wire, ribbon, or lead may be, as well as Al, Cu or Au.

Then, the leadframe 21a, the semiconductor element 34, and the wires 39 and 40 are sealed with a sealing resin 41 (Step S29). This sealing is conducted by using transfer molding with, for example, a thermosetting epoxy resin. The epoxy resin contains a filler.

Metal lead exposed portions such as portions to be coupled to a mounting board are subjected to solder plating 42a and 42b (Step S30). Finally, the leadframe 21a is cut into an intended shape (Step S31) to complete a semiconductor device 45 shown in FIG. 17 (Step S32).

As shown in FIG. 17, roughened Zn alloy layers 32b, 32c, and 32d are covered with the sealing resin 41 so that they have improved bond strength with the sealing resin 41.

(3) Conclusion

According to Second Embodiment, at least regions of the leadframe 21 to be sealed by the sealing resin 41, except regions 12 and 14 to be bonded to the die bond region 33 via a wire or ribbon, have been plated with Zn. By the heat treatment, Zn and the metal of the leadframe 21 constitute roughened Zn alloy layers 32a, 32b, 32c, and 32d. This makes it possible to drastically improve the interfacial bond strength of the leadframe 21a and the sealing resin 41 after molding of the sealing resin 41.

In the semiconductor device thus obtained, the sealing resin 41 is firmly bonded to the die pad 9 or die pad lead terminal 11 due to a mechanical anchor effect. No interfacial peeling occurs between the die pad 9 or the die pad lead terminal 11 and the sealing resin 41. As a result, it is possible to provide a semiconductor device capable of preventing thermal-stress-induced cracks at the interface in the sealing resin 41 and therefore having high reliability.

In addition, in the semiconductor device thus obtained, neither deterioration in the quality of the die bonding or wire bonding nor interfacial peeling between the die pad 9 or bonding pad 12 or 14 and the sealing resin 41 occurs.

As a result, concentration of thermal stress which will otherwise occur due to temperature fluctuations at each joint (joint between the sealing resin 41 and the die pad 9 or the die pad lead terminal 11) can be avoided and compressive stress is constantly applied to the joint. Accordingly, generation of through cracks at the joint can be prevented, making it possible to provide a highly reliable semiconductor device.

It is therefore possible to provide a highly reliable semiconductor device even when it is used particularly in a severe environment exposed to high temperature and high humidity or in an environment exposed to temperature fluctuations in repetition.

In Second Embodiment, as an adhesion improving treatment, Zn plating is followed by heating and alloying treatment. The bonding strength with the sealing resin can be improved under the same treatment conditions without depending on the quality of the leadframe. Even if the leadframe is a composite member made of metals different in kind, a semiconductor device with high reliability can be provided.

Since the adhesion with a resin can be improved by the same treatment irrespective of the kind of the metal, the number of the treatment lines of the leadframe can be decreased, leading to a reduction in equipment cost. In addition, consumption of the solution can be decreased by using a Zn metal plate as an electrode. The pretreatment is conducted in a relatively rough manner and use of high-speed plating can reduce the plating time so that a treatment method with a small running cost can be provided and a production cost can be reduced.

Third Embodiment

Figure 18:
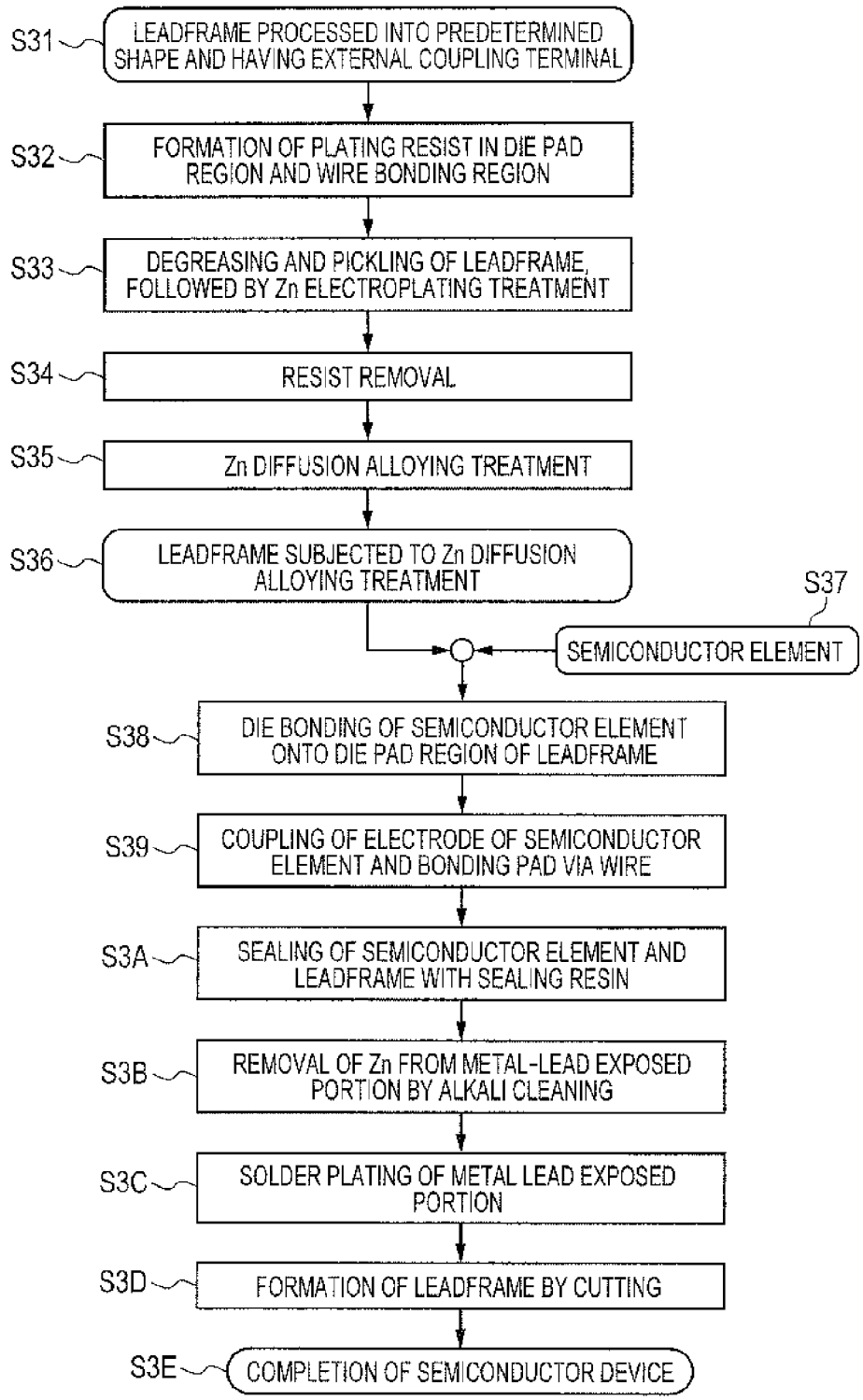
FIG. 18 is a step flow chart showing manufacturing steps based on a manufacturing method of a semiconductor device according to Third Embodiment.

FIG. 18 is a step flow chart showing a manufacturing method of a semiconductor device according to Third Embodiment. FIGS. 19A to 19F include plan views (left side) and cross-sectional views (right side) corresponding to the step flow shown in FIG. 18. They each correspond to one semiconductor device.

Figure 20A:
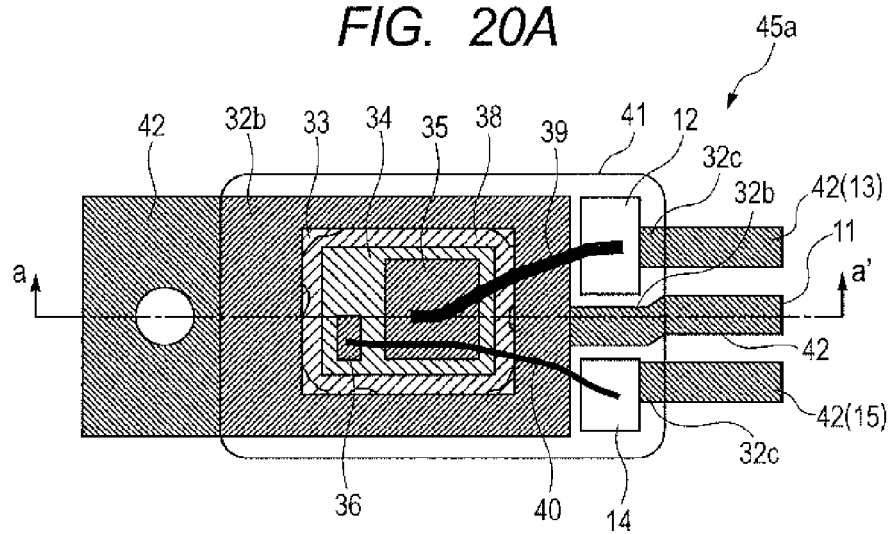
FIG. 20A and FIG. 20B shows a semiconductor device manufactured by using the manufacturing method of a semiconductor device according to Third Embodiment
Figure 20B:
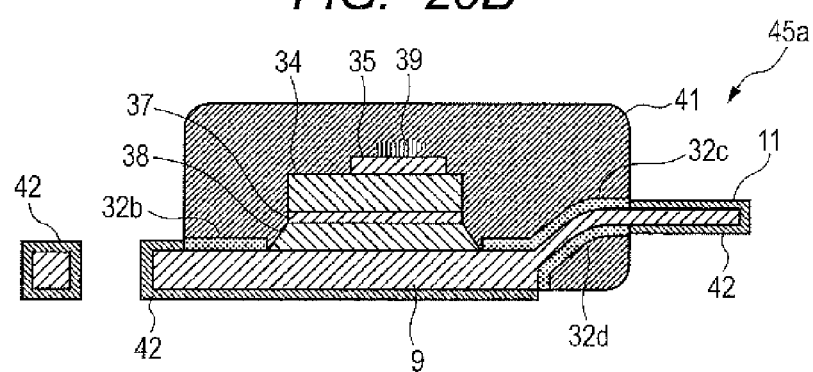

FIG. 20 includes a plan view FIG. 20A and a cross-sectional view FIG. 20B of the semiconductor device manufactured using the manufacturing method of a semiconductor device according to Third Embodiment. In FIG. 20, FIG. 20A is a plan view from which an upper portion of the sealing resin has been removed and FIG. 20B is a cross-sectional view taken along a line a-a' of FIG. 20A.

In Third Embodiment, Zn diffusion alloying treatment is conducted similar to Second Embodiment except that plating resist is used as a plating mask.

Next, based on the step flow of FIG. 18, Third Embodiment will be described referring to FIG. 19 and FIG. 20.

(1) Step of Preparing a Leadframe

First, a step of preparing a leadframe to be used in a fabrication step will be described. As shown in FIG. 19A, a leadframe 21b is prepared (Step S31). The leadframe 21b used here is similar to the leadframe 21 except that the former one does not have the sealing resin fixing trench 16.

As shown in FIG. 19B, the plating resists 43a, 43b, and 43c are formed on the die bond region 33, the main electrode bonding pad 12, and the control electrode bonding pad 14 of the leadframe 21b, respectively, to cover therewith (Step S32).

As shown in FIG. 19C, after degreasing and pickling of the leadframe 21b and electro Zn plating to selectively form a Zn plating film 44 in a region not covered with the solder resists 43a, 43b, and 43c (Step S33). The plating is conducted under the following conditions: at a current density of 3 A/dm$^2$ and for a plating time of 200 s.

Then, the solder resists 43a, 43b, 43c are removed (Step S34). As shown in FIG. 19D, Zn diffusion alloying treatment is conducted to form roughened Zn alloy layers 32a, 32b, 32c, 32d (Step S35). The alloying treatment is conducted in an H$_2$ gas atmosphere, at heating temperature of 400° C., and for heating time of 2 minutes. This enables preparation of the leadframe 21c which has finished the Zn diffusion alloying treatment (Step S36).

(2) Fabrication Step

The fabrication step of the semiconductor device will next be described. The leadframe 21c which has finished the Zn diffusion alloying treatment and a semiconductor element 34 are prepared (Step S36, Step S37). As the semiconductor element 34, a semiconductor chip similar to that of Second Embodiment is used.

As shown in FIG. 19E, a back electrode 37 of the semiconductor element 34 is die bonded onto a die pad 9 of the leadframe 21b with a die bond material 38 (Step S38). The die bond material usable here is, for example, a high-melting-point solder, an Ag sinter paste, or a resin bonded Ag paste. Examples of the high-melting-point solder include Pb solder and SnSb solder.

The electrodes 35 and 36 of the semiconductor element 34 are coupled to the main electrode bonding pad 12 and the control electrode bonding pad 14 of a lead terminal via wires 39 and 40, respectively (Step S39). The material of the electrodes 35 and 36 is, for example, Al. Instead of the wires 39 and 40, a ribbon, or a lead may be used for coupling. The material of the wire, ribbon, or lead may be, as well as Al, Cu or Au.

As shown in FIG. 19F, the leadframe 21c, the semiconductor element 34, the wires 39 and 40, the main electrode bonding pad 12, the control electrode bonding pad 14, and the like are sealed with a resin (Step S40). For this sealing, transfer molding with, for example, a thermosetting epoxy resin may be employed. The epoxy resin contains a filler. The semiconductor element 34, the wires 39 and 40, the main electrode bonding pad 12, the control electrode bonding pad 14, and the like are covered with this sealing resin 41. The plan view of FIG. 19F shows after removal of the upper portion of the resin.

Then, Zn of the metal lead exposed portion is removed by alkali cleaning (Step S41), followed by solder plating of the metal lead exposed portion (Step S42). An unnecessary portion of the leadframe 21c is cut to obtain an intended shape (Step S43). As a result, a semiconductor device 45a as shown in FIG. 20 is completed (Step S44).

Figure 19:
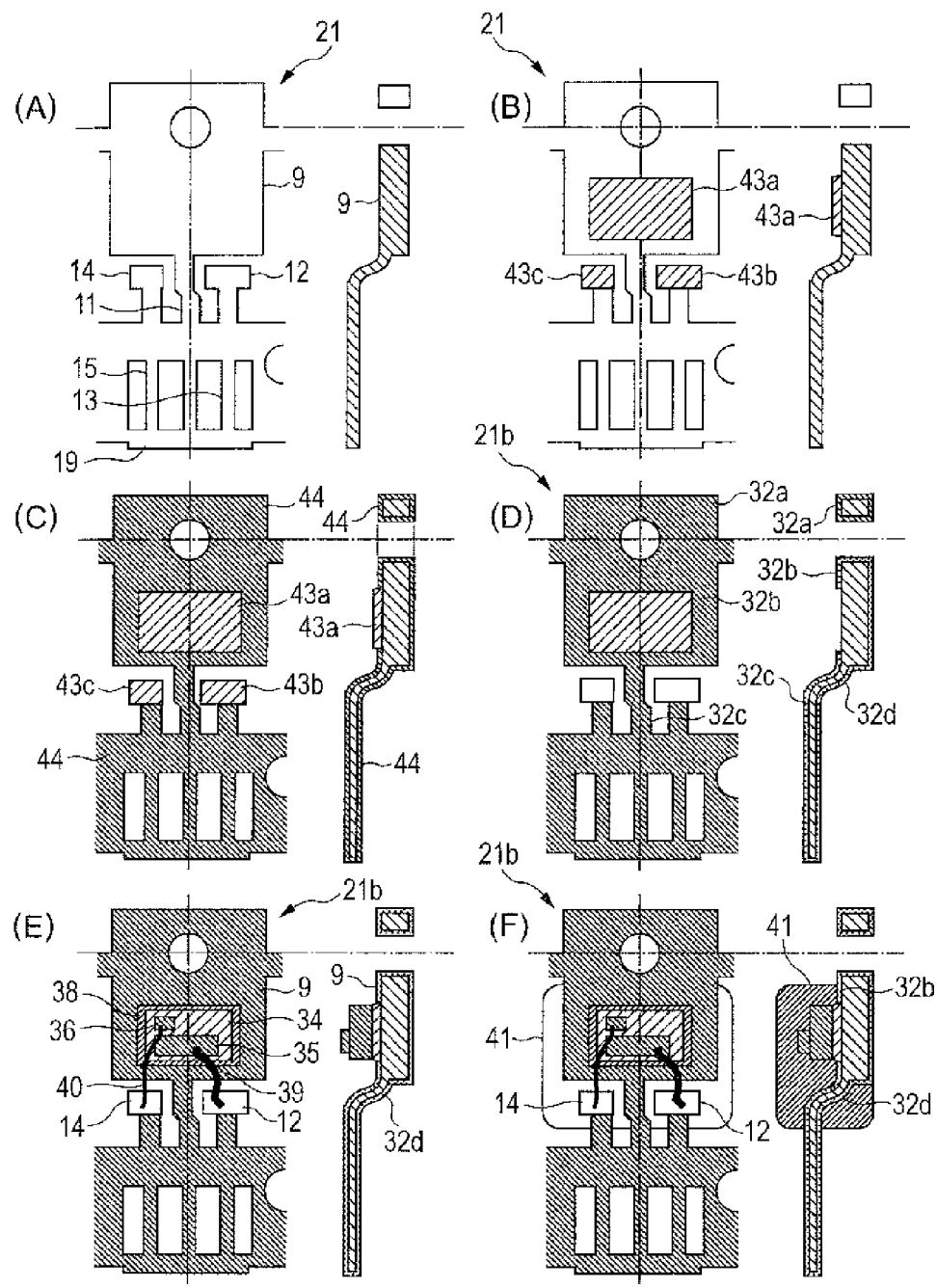
FIG. 19 includes plan views and cross-sectional views of leadframe appearances corresponding to the individual steps of the step flow chart of the manufacturing method of a semiconductor device according to Third Embodiment.

In FIG. 19, the main electrode bonding pad 12 and the control electrode bonding pad 14 may be replaced by a source electrode bonding pad and a gate electrode bonding pad, respectively.

Similarly, the electrodes 35 and 36 of the semiconductor element may be replaced by a source electrode and a gate electrode, respectively.

The wires 39 and 40 may be replaced by a source electrode wire and a gate electrode wire, respectively.

(3) Conclusion

According to Third Embodiment, Zn plating is applied to at least a region of the leadframe 21 to be sealed with the sealing resin 41 except regions 12 and 14 to be bonded to the die bond region 33 via a wire or ribbon. By the heating treatment, the roughened Zn alloy layers 32b, 32c, and 32c are formed from Zn and the metal of the leadframe 21. As a result, it is possible to improve the interfacial bond strength between the leadframe 21b and the sealing resin 41 after molding of the sealing resin 41. In short, Third Embodiment can produce advantages similar to those of First Embodiment and Second Embodiment.

Third Embodiment includes, in addition to the steps of Second Embodiment, Step S32, Step S34, and Step SB. In Third Embodiment, however, the die pad lead terminal 11, the main electrode lead terminal 13, and the control electrode lead terminal 15 covered with the sealing resin 41 have been subjected to the roughening treatment with Zn so that compared with the semiconductor device of Second Embodiment, that of Third Embodiment has improved interfacial bond strength between the leadframe 21b and the sealing resin 41.

Fourth Embodiment

Figure 21:
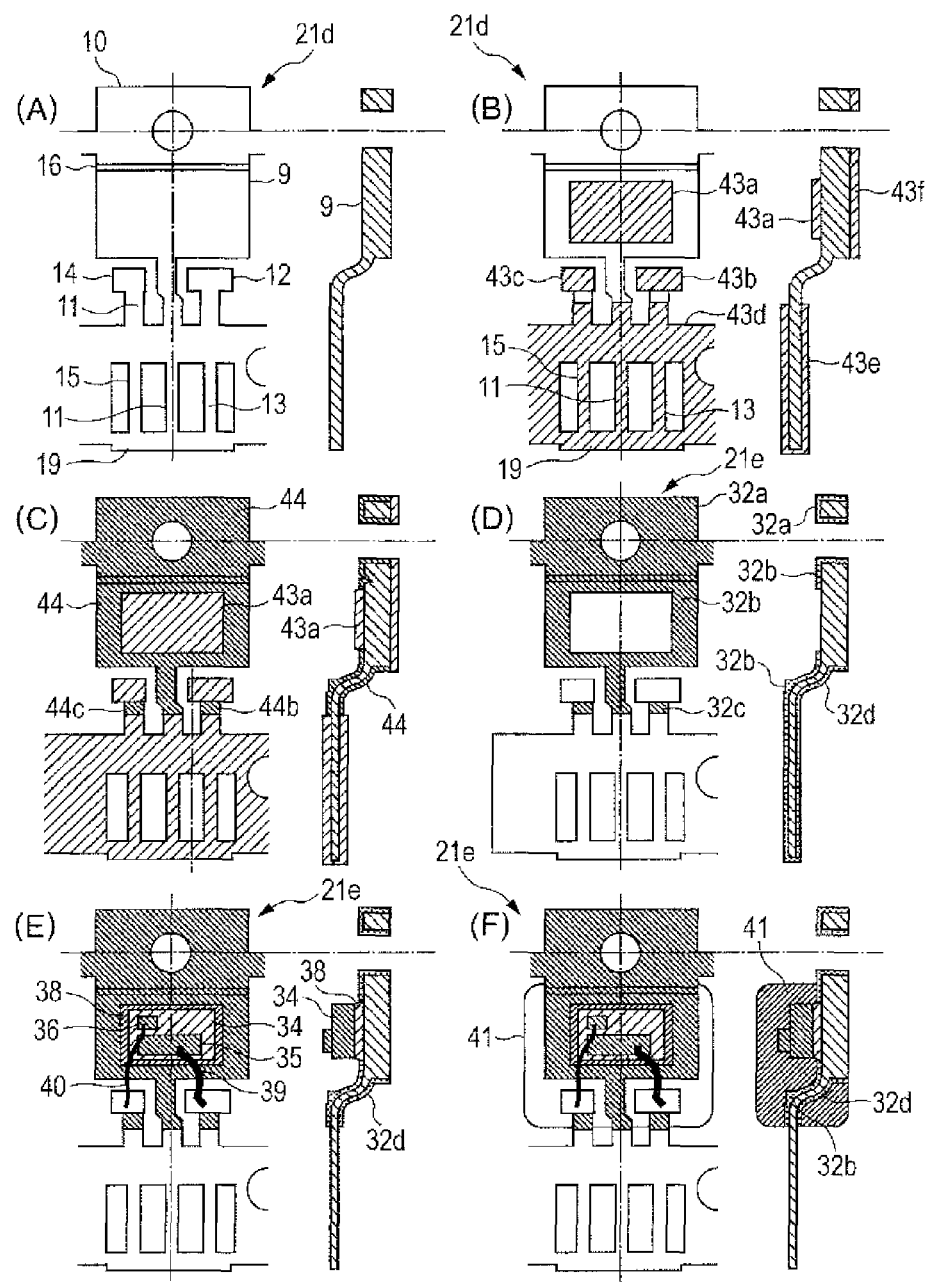
FIG. 21 includes plan views and cross-sectional views of leadframe appearances showing the manufacturing method of a semiconductor device according to Fourth Embodiment.

FIG. 21 shows a manufacturing method of a semiconductor device according to Fourth Embodiment and it includes plan views and cross-sectional views of the manufacturing steps. In FIG. 21A to FIG. 21F, plan views are shown on the left side and cross-sectional views are shown on the right side. Each view corresponds to one semiconductor device.

In Fourth Embodiment, similar to Third Embodiment, Zn diffusion alloying treatment is conducted using a plating resist. The formation place of the plating resist in Fourth Embodiment is however different from that of Third Embodiment. Another difference from Third Embodiment is that a sealing resin fixing trench 16 lies between a die pad 9 and a header 10. They are similar except the above-mentioned points.

As is drawn in FIG. 21B, the surface and back surface each of a die pad lead terminal 11, a main electrode lead terminal 13, a control electrode lead terminal 15, and a framework 19 are covered with plating resists 43d and 43e, respectively. Also the back surface of the die pad 9 is covered with a resist 43f.

As shown in FIG. 21C, the leadframe 21d is degreased and pickled. Then, electro Zn plating is conducted to selectively form a Zn plating film 44 in regions not covered with the plating resists 43a, 43b, 43c, 43d, 43e, and 43f. Plating is conducted under the following conditions: at a current density of 3 A/dm$^2$ and for a plating time of 200 s.

As shown in FIG. 21D, after removal of the plating resists 43a, 43b, 43c, 43d, 43e, and 43f, Zn diffusion alloying treatment is conducted. Roughened Zn alloy layers 32a, 32b, 32c, and 32d are formed to prepare a leadframe 21e. The Zn diffusion alloying treatment is conducted under the following conditions: in a $H_2$ gas atmosphere, at heating temperature of 400° C., and for a heating time of 2 minutes.

The fabrication step of the semiconductor device is similar to that of Third Embodiment.

As shown in FIGS. 21D, 21E and 21F, in Fourth Embodiment, no roughened Zn alloy layer 32 is formed on each of a die pad lead terminal 11, a main electrode lead terminal 13, and a control electrode lead terminal 15 exposed from a sealing resin 41, which is a difference from Third Embodiment.

Fourth Embodiment can produce advantages similar to those produced by First Embodiment to Third Embodiment. In Fourth Embodiment, advantages similar to those obtained in First Embodiment to Third Embodiment can be obtained. In Fourth Embodiment, the number of regions in which plating resists are formed is greater than that in Third Embodiment. In Fourth Embodiment, however, no roughened Zn alloy layer is formed on the metal lead exposed portion and therefore, Step S3B is not necessary, making it possible to reduce the number of the steps compared with Third Embodiment.

Fifth Embodiment

Figure 22:
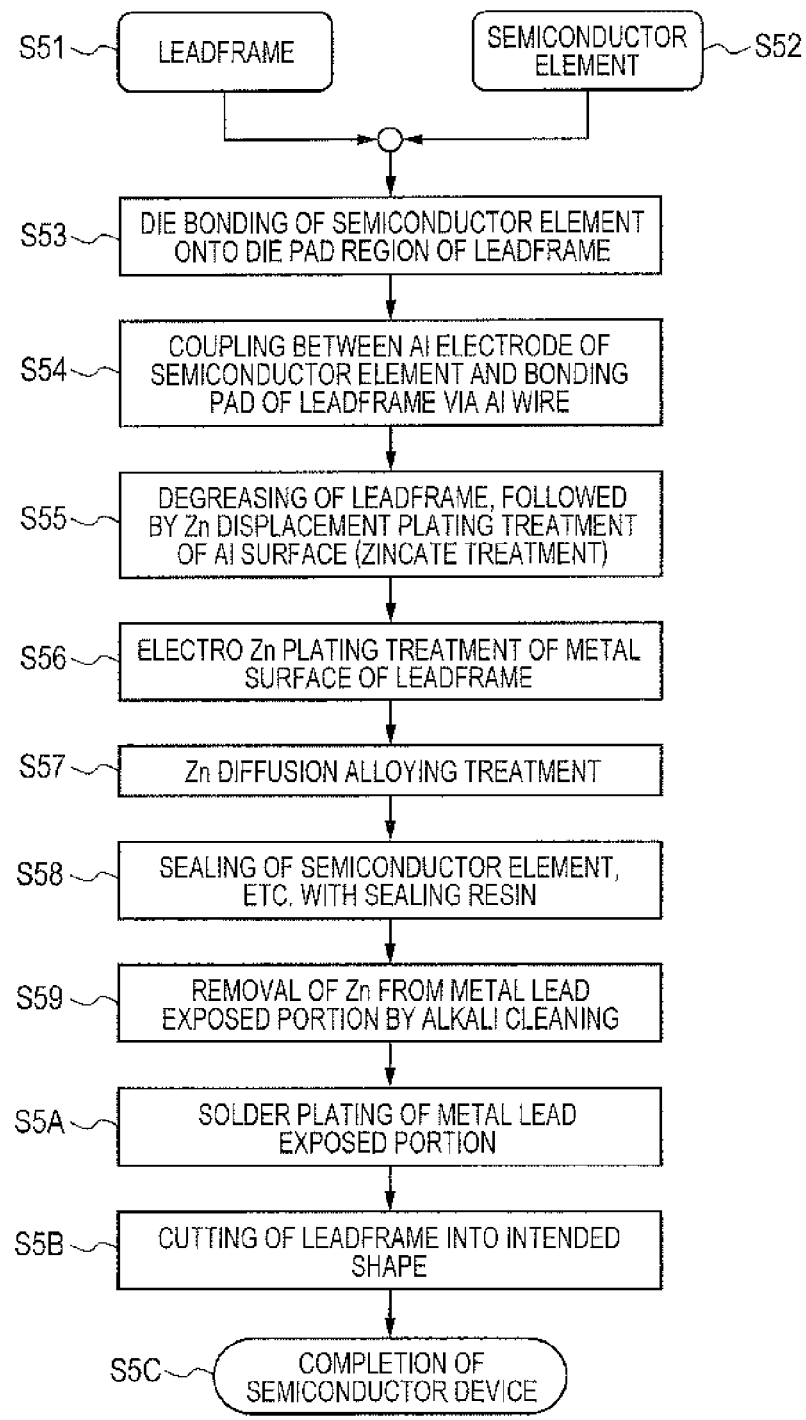
FIG. 22 is a step flow chart showing the manufacturing steps based on a manufacturing method of a semiconductor device according to Fifth Embodiment.
Figure 23A:
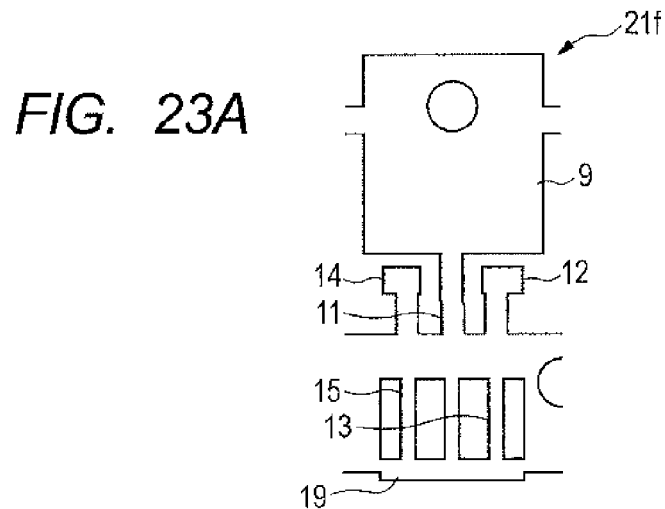
FIG. 23A is a plan view of a leadframe used for the manufacturing method of a semiconductor device according to Fifth Embodiment.
Figure 23B:
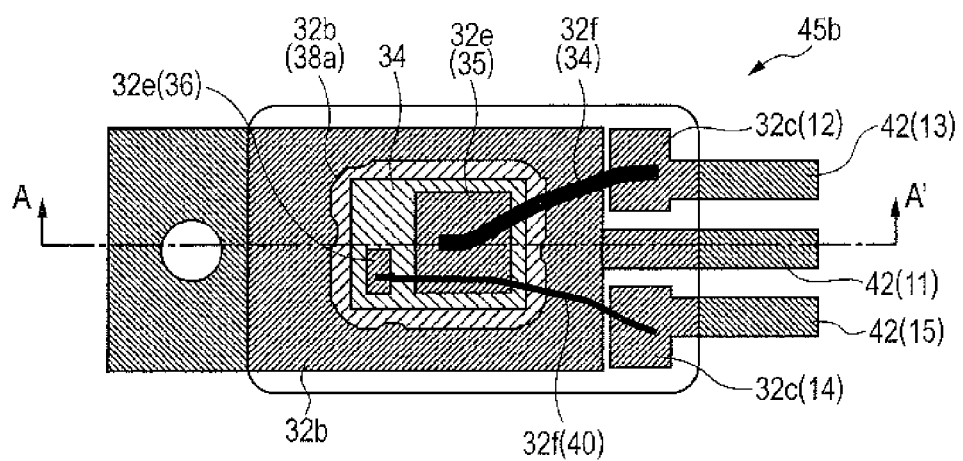
FIG. 23B is a plan view of the semiconductor device manufactured by the Fifth Embodiment.

FIG. 22 is a step flow chart showing a manufacturing method of a semiconductor device according to Fifth Embodiment. FIG. 23 includes a plan view FIG. 23A of a leadframe used for the manufacturing method of a semiconductor device according to Fifth Embodiment, and a plan view FIG. 23B and a cross-sectional view FIG. 23B of the semiconductor device manufactured by this manufacturing method. In FIG. 22, FIG. 22 is a plan view from which the upper portion of a sealing resin has been removed; and FIG. 22C is a cross-sectional view taken along a line A-A' of FIG. 22B.

Fifth Embodiment is different from Second Embodiment to Fourth Embodiment in that after bonding of a semiconductor element to a predetermined position of the leadframe, Zn plating and Zn diffusion alloying treatment are conducted.

As shown in FIG. 22, a leadframe 21f and a semiconductor element 34 are prepared (Steps S51 and S52). As the semiconductor element 34, a semiconductor chip similar to that employed in Second Embodiment is used. A back electrode 37 of the semiconductor element 34 is die bonded onto a die pad 9 of the leadframe 21f with a die bond material 38a (Step S53). As the die bond material 38a, for example, an Ag sinter paste is used. A main electrode 35 of the semiconductor element 34 and a main electrode bonding pad 12, and a control electrode 36 and a control electrode bonding pad 14 are coupled via Al wires (or Al ribbons) 39 and 40, respectively (Step S54).

After degreasing the leadframe 21f, the Al surface is subjected to Zn displacement plating treatment (zincate treatment) (Step S55) and then, the metal surface of the leadframe 21f is subjected to electro Zn plating treatment (Step S56). This plating is conducted under the following conditions: at a current density of 3 A/dm$^2$ and for a plating time of 200 s.

Then, Zn diffusion alloying treatment is conducted (Step S57). This treatment is conducted under the following conditions: in a $H_2$ gas atmosphere, at a heating temperature of 400° C., and for heating time of 2 min.

Then, the semiconductor element 34, wires 39 and 40, a main electrode bonding pad 12, a control electrode bonding pad 14, and the like are sealed with a resin (Step S58). Sealing is conducted using transfer molding while using, for example, a thermosetting epoxy resin. The epoxy resin contains a filler. Then, Zn of the metal lead exposed portion is removed by alkali cleaning (Step S59), followed by solder plating on the metal lead exposed portion (Step S5A).

A framework 19 or the like of the leadframe is cut into an intended shape (Step S5B) to complete a semiconductor device 45b (Step S5C).

Figure 23C:
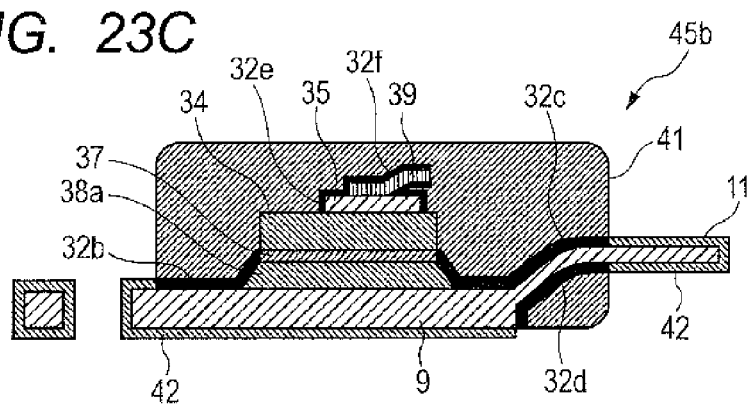
FIG. 23C is a cross-sectional view of FIG. 23B.

As shown in FIGS. 23B and 23C, the die pad 9, a die pad lead terminal 11, a main electrode lead terminal 13, and a control electrode lead terminal 15 have, on the surfaces thereof, roughened Zn alloy layers 32b, 32c, and 32d so that they have improved adhesion with the sealing resin 41. In addition, the main electrode 35, the control electrode 36, the main electrode bonding wire 39, and the control electrode bonding wire 40 have, on the surfaces thereof, roughened Zn alloy layers 32e and 32f so that they have improved adhesion with the sealing resin 41.

Fifth Embodiment also can produce excellent advantages similar to those described in First Embodiment to Fourth Embodiment. Fifth Embodiment requires zincate treatment, but in Fifth Embodiment, die bonding and wire bonding are followed by Zn diffusion alloying treatment so that masking of the leadframe, which is used in Second Embodiment to Fourth Embodiment, is not necessary. It is therefore possible to reduce the number of steps in Fifth Embodiment compared with Fourth Embodiment.

Sixth Embodiment

Figure 24:
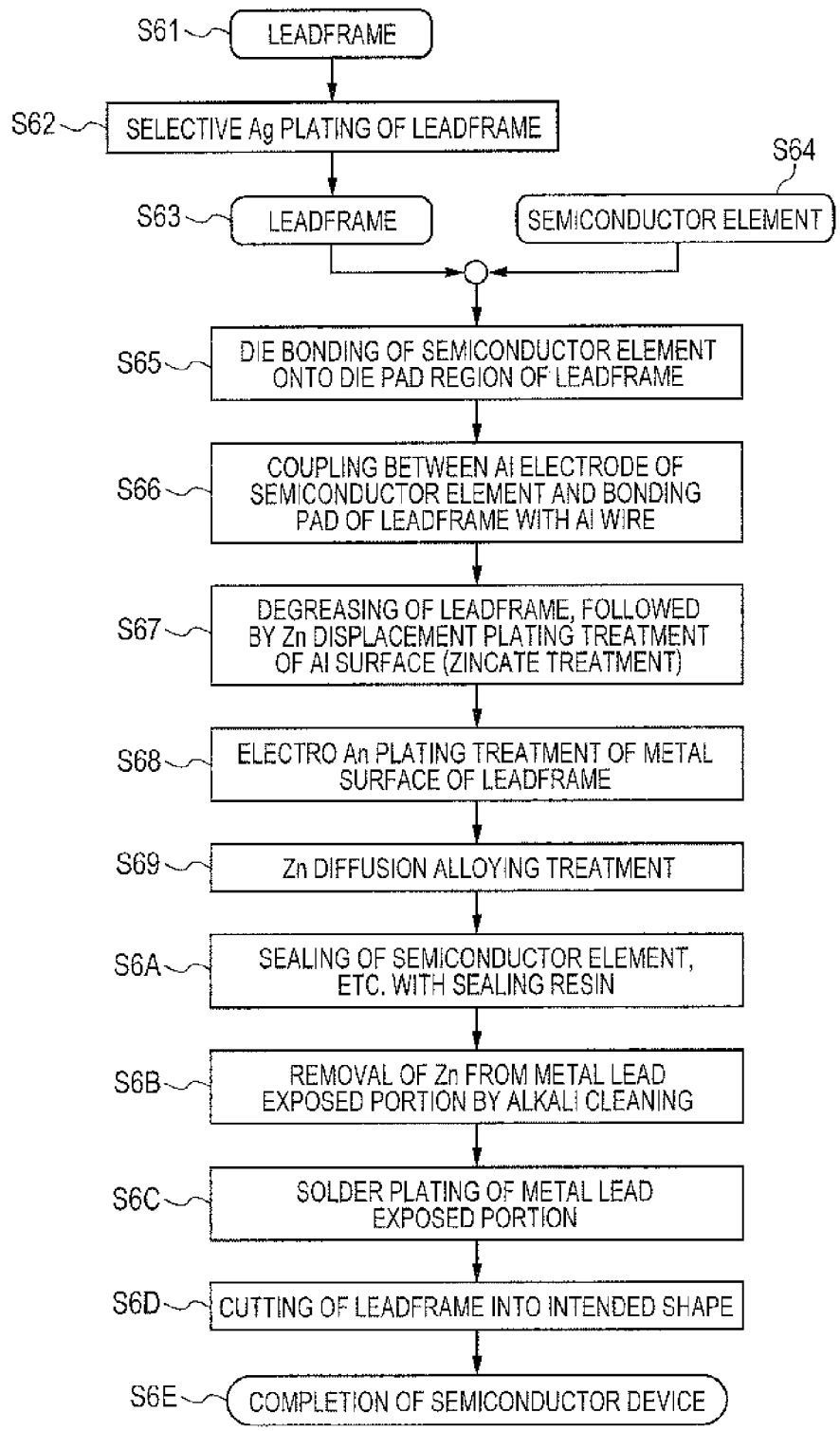
FIG. 24 is a step flow chart showing the manufacturing steps based on a manufacturing method of a semiconductor device according to Sixth Embodiment.
Figure 25A:
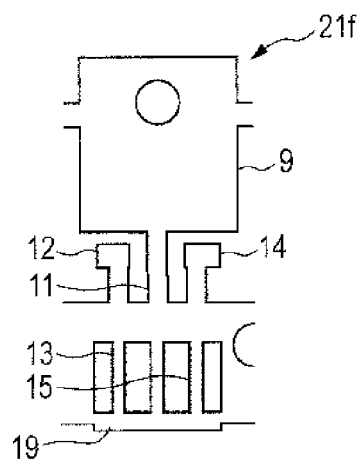
FIG. 25A is a plan view of the leadframe used for the manufacturing method of a semiconductor device according to Six Embodiment.

FIG. 24 is a step flow chart showing a manufacturing method of a semiconductor device according to Sixth Embodiment. FIG. 25 shows a leadframe to be used in Sixth Embodiment and a semiconductor device manufactured using the manufacturing method of a semiconductor device. In FIG. 25, FIG. 25A is a plan view of the leadframe, FIG. 25B is a plan view of a processed leadframe, FIG. 25C is a plan view from which the upper portion of a sealing resin has been removed; and FIG. 25D is a cross-sectional view taken along a line a-a' of FIG. 25C.

In Sixth Embodiment, similar to Fifth Embodiment, a semiconductor element is bonded to a predetermined position of the leadframe, followed by Zn plating and Zn diffusion alloying treatment.

As shown in FIG. 25A, a leadframe 21f processed into a predetermined shape and having an external terminal is prepared (Step S61).

Figure 25B:
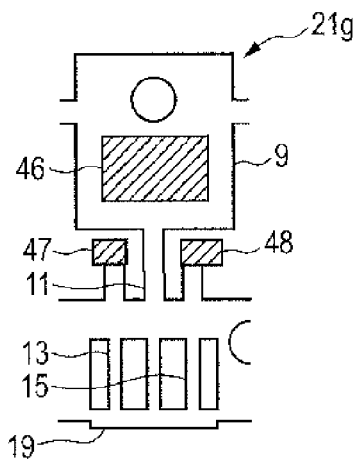
FIG. 25B is a plan view of a processed leadframe.
Figure 25C:
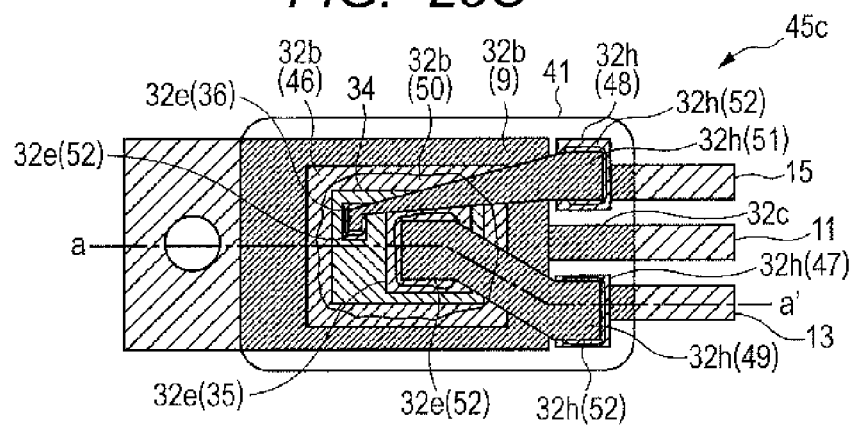
FIG. 25C is a plan view from which the upper portion of a sealing resin has been removed according to Six Embodiment.
Figure 25D:
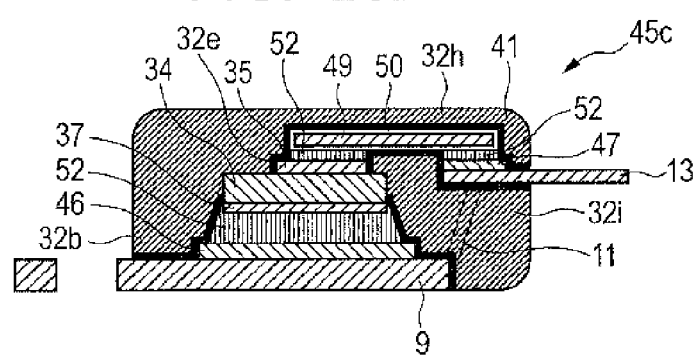
FIG. 25D is a cross-sectional view taken along a line a-a' of FIG. 25C.

As shown in FIG. 25B, Ag plating is formed on a die bonding region 33, a main electrode die bonding 12, and a control electrode die bonding 14 of the leadframe 21f (Step S62). This means that a die bonding Ag plating pad 46, a main electrode Ag plating pad 47, and a control electrode Ag plating pad 48 are formed on the leadframe 21f. The main electrode Ag plating pad 47 is also called a first plating pad, the control electrode Ag plating pad 48 is also called a second plating pad, and the die bonding Ag plating pad 46 is called a third plating pad.

As a result, a leadframe 21g to be used in the fabrication step is prepared (Step S63).

As shown in FIG. 24, the leadframe 21g and a semiconductor element 34a are prepared (Steps S63 and S64). The semiconductor element 34a is different from the semiconductor element 34 only in the positions of the electrodes 35 and 36.

A back electrode 37 of the semiconductor element 34a is die bonded onto a die pad 9 of the leadframe 21g with a bonding material 52 (Step S65). For example, an Ag sinter paste can be used as the bonding material 52.

The main electrode 35 of the semiconductor element 34a and the main electrode Ag plating pad 47, and the control electrode 36 and the control electrode Ag plating pad 48 are coupled to each other via a main electrode coupling lead 49 and a control electrode coupling lead 51, respectively (Step S66). As the main electrode coupling lead 49 and the control electrode coupling lead 51, for example, an Ag-plated Cu lead is used. The main electrode 35 and the main electrode coupling lead 49 and the main electrode Ag plating pad 47 and the main electrode coupling lead 49 are coupled with the bonding material 52. For coupling between the control electrode 36 and the control electrode coupling lead and coupling between the control electrode Ag plating pad 48 and the control electrode coupling lead, the bonding material 52 is used. The main electrode coupling lead 49 may also be called first coupling lead and the control electrode coupling lead may also be called second coupling lead.

After degreasing of the leadframe 21g, an Al surface is subjected to Zn displacement plating treatment (zincate treatment) (Step S67) and the metal surface of the leadframe 21g is subjected to electro Zn plating treatment (Step S68). This plating is conducted under the following conditions: at a current density of 3 A/dm$^2$ and for a plating time of 200 s.

Then, Zn diffusion alloying treatment is conducted (Step S69). This treatment is conducted under the following conditions: in a $H_2$ gas atmosphere, at a heating temperature of 400° C., and for a heating time of 2 min.

Then, the semiconductor element 34a, the main electrode coupling lead 49, the control electrode coupling lead 51, and the like are sealed with a resin (Step S6A). Sealing is conducted by transfer molding using, for example, a thermosetting epoxy resin. The epoxy resin contains a filler. From the metal lead exposed portion, Zn is removed by alkali cleaning (Step S6B). Then, solder plating is applied to the metal lead exposed portion (Step S6C).

Then, a framework 19 and the like of the leadframe is cut into an intended shape (Step S6D) and a semiconductor device 45b is completed (Step S6E).

As shown in FIGS. 25C and 25D, the die pad 9 and a die pad lead terminal 11 have, on the surfaces thereof, roughened Zn alloy layers 32b and 32c, respectively. The main electrode 35 and the control electrode 36 each have, on the surfaces thereof, a roughened Zn alloy layer 32e. A main electrode lead terminal 13 and a control electrode lead terminal 15, and the main electrode coupling lead 49 and the control electrode coupling lead 51 have, on the surfaces thereof, roughened Zn alloy layers 32h and 32i, respectively. These members have therefore improved adhesion with the sealing resin 4. Incidentally, since the control electrode coupling lead 51 is covered with the roughened Zn alloy layer 32h, it is not shown directly.

In Sixth Embodiment, advantages similar to those in Fifth Embodiment can be obtained.

Seventh Embodiment

Figure 26A:
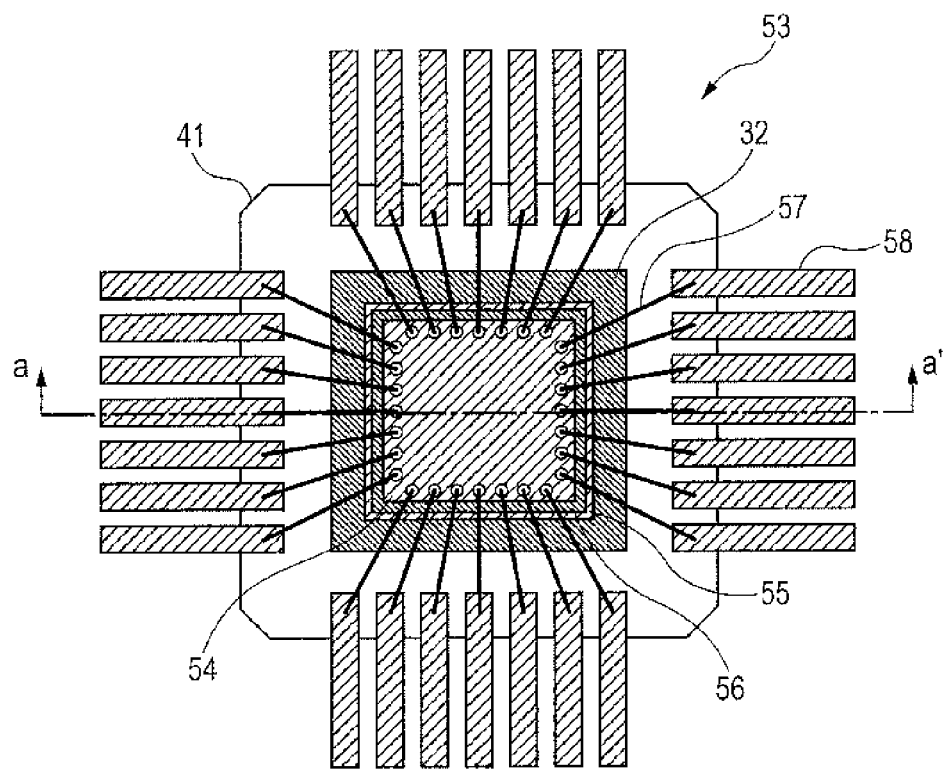
FIG. 26A is a plan view of the semiconductor device from which an upper portion of a sealing resin has been removed according to Seventh Embodiment.
Figure 26B:
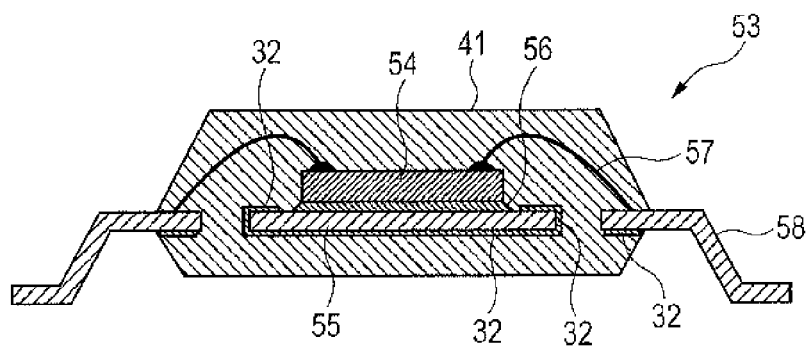
FIG. 26B is a cross-sectional view taken along a line a-a' of FIG. 26A.

FIG. 26 includes a plan view and a cross-sectional view of a semiconductor device according to Seventh Embodiment. In FIG. 26, FIG. 26A is a plan view of the semiconductor device from which an upper portion of a sealing resin has been removed, while FIG. 26B is a cross-sectional view taken along a line a-a' of FIG. 26A.

The semiconductor device of Seventh Embodiment is different from the semiconductor devices manufactured using the manufacturing method of a semiconductor device according to Second Embodiment to Sixth Embodiment in that even the surface of the leadframe on which a semiconductor element is not mounted is sealed with a sealing resin. Except this, the semiconductor device of Seventh Embodiment is manufactured, for example, by a method similar to the manufacturing method of a semiconductor device according to First Embodiment to Fourth Embodiment.

A semiconductor device 53 according to Seventh Embodiment is obtained by fixing a semiconductor element 54 onto a tab 55 of a leadframe by die bonding and then sealing with a sealing resin 41. This sealing is conducted, for example, by transfer molding using a thermosetting epoxy resin. The epoxy resin contains a filler. The semiconductor element 54 is, for example, a signal processing LSI (Large Scale Integrated Circuit) of microcomputer, ASIC, or the like. As the die bond material 56, for example, an Ag paste such as resin Ag paste or Ag sinter paste is used. The tab corresponds to the die pad 9 of Second Embodiment to Sixth Embodiment.

A roughened Zn alloy layer 32 is formed on the surface, back surface, and side surface of the tab 55 except a portion of the tab 55 to which the semiconductor element 54 is to be fixed.

In addition, the roughened Zn alloy layer 32 is also formed in a region of the lead 58 covered with the sealing resin 41 except a region to which the bonding wire 57 is to be coupled. In FIG. 26, the roughened Zn alloy layer 32 on the upper surface of the lead is not shown, but when the region to which the bonding wire 57 is coupled is far from the edge of the sealing resin 41, the roughened Zn alloy layer 32 is formed also on the upper surface of the lead 58.

FIG. 26 shows a QFP (Quad Flat Package) whose leads 58 extend from the sealing resin 41 in four directions. A QFP whose leads extend in two directions or in one direction may be used. Examples of the QFP whose leads extend in two directions include SOP (Small Outline Package). For example, when the semiconductor element 54 is a small signal transistor, it is preferred to use a QFP whose leads extend only in two directions or in one direction. When a plurality of small signal transistors is sealed with one sealing resin 41, a QFP whose leads extend only in two directions is preferred.

The semiconductor device according to Seventh Embodiment can produce similar advantages to the semiconductor devices of First Embodiment to Sixth Embodiment. Since the back surface of the tab 55 is in contact with the sealing resin 41, the contact area with the sealing resin increases, which improves adhesion between the sealing resin 41 and the leadframe. Moreover, the roughened Zn alloy layer 32 is formed also on the back surface of the tab 55, which further improves adhesion between the sealing resin 41 and the leadframe.

CONCLUSION

Metallizing specifications of the leadframe surface, die bond materials, and coupling materials used in First Embodiment to Seventh Embodiment are listed in FIG. 27 according to the type of semiconductor devices. Combinations of the device, die bond material, LF surface, die pad, coupling material, and bonding pad shown in FIG. 27 are preferred examples.

The term "device" as used in this table means a semiconductor device and it is also called "semiconductor element". The term "TRS" means a transistor.

The term "coupling material" as used in this table means a conductor electrically coupling the electrode of a semiconductor element to the external coupling terminal of a leadframe.

The term "die pad" as used in this table means a place to which the semiconductor element is to be coupled. The die pad is also called "tab". The term "bonding pad" means a place to which the coupling material is to be coupled.

The term "die bond material" as used in this table means a die bonding material which is used for coupling the semiconductor element to the die pad.

The term "LF surface" as used in the table means the surface of a leadframe. The Ni, Pd/Au, and Ag listed in the column of the LF surface are metallization layers on the LF surface, respectively. The term "Cu" means a leadframe material itself. The material of the leadframe is Cu or a Cu alloy.

The Ni, Pd/Au, and Ag listed in the columns of the die pad and the bond pad are also metallization layers on the LF surface and Cu is a leadframe material itself. When the materials of the die pad and the bond pad are different from the material on the LF surface, the materials of the die pad and the bond pad are formed by plating or the like of the die pad and bond pad regions of the leadframe.

When the coupling material is a wire or ribbon, the electrode of the semiconductor element is preferably an Al electrode. When it is an Ag-plated Cu lead, the electrode is preferably a Ni/Au metallization electrode.

As shown in FIG. 27, as the semiconductor element, for example, a power transistor, a small signal transistor, or a signal processing LSI is used. The power transistor uses a leadframe made of Cu or a Cu alloy and a leadframe obtained by metallizing the surface of Cu or a Cu alloy with Ni. The small signal transistor and signal processing LSI use a leadframe made of Cu or a Cu alloy and a leadframe obtained by metallizing the surface of Cu or a Cu alloy with Pd/Au, Ag, or Ni.

As is apparent from this table, the invention can be applied to leadframes of various metallizing specifications according to the above embodiments and in addition, can be applied to various semiconductor devices.

The invention made by the present inventors has so far been described specifically based on Embodiments. It should however be borne in mind that the invention is not limited to or by these Embodiments but can be modified without departing from the gist of the invention.

For example, a description was made on a power transistor, a small signal transistor, and a signal processing LSI in the above-mentioned embodiments, but the invention can be used not only for them but also for a resin-sealing type diode, resin sealing type IC, and other LSIs. Moreover, the invention can be used for a so-called single-side molded type semiconductor device, that is, a device having a back-surface-exposed die pad or tab.

What is claimed is:

1. A semiconductor device comprising:
   a metal member having a Zn-containing layer;
   a semiconductor element bonded to a surface of the metal member, and
   a sealing resin covering the Zn-containing layer, the semiconductor element, and the metal member; wherein the Zn-containing layer has a plurality of irregularities and at least one of the plurality of irregularities has an overhang structure,
   wherein the overhang structure comprises a projection portion at an upper part of the at least one of the plurality of irregularities and a recess portion at a lower port of the at least one of the plurality of irregularities.

2. The semiconductor device according to claim 1, wherein the Zn-containing layer is an alloy layer formed by the alloying treatment of a Zn plating formed on the surface of the metal member and an underlying metal.

3. The semiconductor device according to claim 1, wherein a back surface of the metal member which is opposite to the surface of the metal member to which the semiconductor element has been bonded is exposed from the sealing resin.

4. A semiconductor device, comprising:
   a Zn alloy layer having a plurality of irregularities and at least one of the plurality of irregularities having an overhang structure, which has been obtained by selectively plating a surface of a metal member with Zn at a plating thickness of 1 µm or greater and then conducting alloying treatment of the Zn and an underlying metal;
   a semiconductor element fixed to the surface of the metal member except a portion where the Zn alloy layer has been formed; and
   a sealing resin covering therewith the Zn alloy layer, the semiconductor element, and the metal member,
   wherein the overhang structure comprises a projection portion at an upper part of the at least one of the plurality of irregularities and a recess portion at a lower port of the at least one of the plurality of irregularities.

* * * * *

UNITED STATES PATENT AND TRADEMARK OFFICE
CERTIFICATE OF CORRECTION

PATENT NO. : 9,177,833 B2  
APPLICATION NO. : 13/768509  
DATED : November 3, 2015  
INVENTOR(S) : Takuya Nakajo et al.

Page 1 of 1

It is certified that error appears in the above-identified patent and that said Letters Patent is hereby corrected as shown below:

IN THE SPECIFICATION

Column 6, Line 33: Delete "1" and insert --1a--

Column 8, Line 57: Delete "Os" and insert --0 s--

Column 13, Line 24: Delete "1" and insert --1a--

Column 13, Line 25: Delete "1" and insert --1a--

Column 13, Line 59: Delete "(Step S30)." and insert --(Step S2A).--

Column 13, Line 60: Delete "(Step S31)" and insert --(Step S2B)--

Column 13, Line 61: Delete "(Step S32)." and insert --(Step S2C).--

Column 15, Line 56: Delete "(Step S40)." and insert --(Step S3A).--

Column 15, Line 65: Delete "(Step S41)," and insert --(Step S3B),--

Column 15, Line 66: Delete "(Step S42)." and insert --(Step S3C).--

Column 16, Line 1: Delete "(Step S43)." and insert --(Step S3D).--

Column 16, Line 2: Delete "(Step S44)." and insert --(Step S3E).--

Column 16, Line 18: Delete "32c" and insert --32d-- (2nd occurrence)

Column 16, Line 26: Delete "Step SB." and insert --Step S3B.--

Column 17, Line 30: Delete "23B" and insert --23C--

Column 17, Line 32: Delete "FIG. 22, FIG.22" and insert --FIG. 23, FIG.23B--

Column 17, Line 35: Delete "22B." and insert --23B.--

Column 19, Line 46: Delete "4." and insert --41.--

Signed and Sealed this  
Twenty-ninth Day of March, 2016

Michelle K. Lee  
*Director of the United States Patent and Trademark Office*